(12) United States Patent
Jang et al.

(10) Patent No.: US 11,417,675 B2
(45) Date of Patent: Aug. 16, 2022

(54) THREE-DIMENSIONAL SEMICONDUCTOR MEMORY DEVICES

(71) Applicant: Samsung Electronics Co., Ltd., Suwon-si (KR)

(72) Inventors: Kiseok Jang, Gimhae-si (KR); Chang-Sun Hwang, Hwaseong-si (KR); Chungki Min, Hwaseong-si (KR); Kieun Seo, Suwon-si (KR); Jongheun Lim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 238 days.

(21) Appl. No.: 16/903,514

(22) Filed: Jun. 17, 2020

(65) Prior Publication Data

US 2021/0159242 A1 May 27, 2021

(30) Foreign Application Priority Data

Nov. 22, 2019 (KR) .................... 10-2019-0151629

(51) Int. Cl.
*H01L 27/11573* (2017.01)
*H01L 27/11524* (2017.01)
(Continued)

(52) U.S. Cl.
CPC .. *H01L 27/11573* (2013.01); *H01L 21/76805* (2013.01); *H01L 21/76819* (2013.01);
(Continued)

(58) Field of Classification Search
CPC ......... H01L 27/11573; H01L 21/76805; H01L 21/76819; H01L 21/76895; H01L 23/535;
(Continued)

(56) References Cited

U.S. PATENT DOCUMENTS 5,290,396 A 3/1994 Schoenborn et al.
5,688,720 A 11/1997 Hayashi
(Continued)

FOREIGN PATENT DOCUMENTS

JP H 07297193 A 11/1995
JP 2002009031 A 1/2002
JP 2016207973 A 12/2016

*Primary Examiner* — Shahed Ahmed
*Assistant Examiner* — Vicki B. Booker
(74) *Attorney, Agent, or Firm* — Harness, Dickey & Pierce, P.L.C.

(57) ABSTRACT

A three-dimensional semiconductor memory device including a peripheral circuit structure on a first substrate, the peripheral circuit structure including peripheral circuits, a second substrate on the peripheral circuit structure, an electrode structure on the second substrate, the electrode structure including a plurality of electrodes that are stacked on the second substrate and a penetrating interconnection structure penetrating the electrode structure and the second substrate may be provided. The penetrating interconnection structure may include a lower insulating pattern, a mold pattern structure on the lower insulating pattern, a protection pattern between the lower insulating pattern and the mold pattern structure, and a penetration plug. The penetration plug may penetrate the mold pattern structure and the lower insulating pattern and may be connected to the peripheral circuit structure. The protection pattern may be at a level lower than that of the lowermost one of the electrodes.

20 Claims, 19 Drawing Sheets

(51) Int. Cl.
  *H01L 27/11556* (2017.01)
  *H01L 27/11529* (2017.01)
  *H01L 21/768* (2006.01)
  *H01L 27/11582* (2017.01)
  *H01L 23/535* (2006.01)
  *H01L 27/1157* (2017.01)

(52) U.S. Cl.
  CPC ...... *H01L 21/76895* (2013.01); *H01L 23/535* (2013.01); *H01L 27/1157* (2013.01); *H01L 27/11524* (2013.01); *H01L 27/11529* (2013.01); *H01L 27/11556* (2013.01); *H01L 27/11582* (2013.01)

(58) Field of Classification Search
  CPC ......... H01L 27/11524; H01L 27/11529; H01L 27/11556; H01L 27/1157; H01L 27/11582
  See application file for complete search history.

(56) References Cited

U.S. PATENT DOCUMENTS

| | | | |
|---|---|---|---|
| 8,822,287 B2 | 9/2014 | Kim et al. | |
| 10,042,783 B2 | 8/2018 | Park | |
| 10,121,677 B2 | 11/2018 | Matsui et al. | |
| 10,141,326 B1* | 11/2018 | Oh | H01L 23/5226 |
| 2015/0372005 A1* | 12/2015 | Yon | H01L 27/11582 |
| | | | 257/314 |
| 2016/0049423 A1* | 2/2016 | Yoo | H01L 27/1157 |
| | | | 257/329 |
| 2016/0086967 A1* | 3/2016 | Lee | H01L 24/05 |
| | | | 257/314 |
| 2016/0307910 A1* | 10/2016 | Son | H01L 27/11582 |
| 2017/0179027 A1* | 6/2017 | Kim | H01L 27/11286 |
| 2017/0256558 A1* | 9/2017 | Zhang | H01L 27/11575 |
| 2018/0315769 A1* | 11/2018 | Huo | H01L 29/10 |

* cited by examiner

THREE-DIMENSIONAL SEMICONDUCTOR MEMORY DEVICES

CROSS-REFERENCE TO RELATED APPLICATIONS

This U.S. non-provisional patent application claims priority under 35 U.S.C. § 119 to Korean Patent Application No. 10-2019-0151629, filed on Nov. 22, 2019, in the Korean Intellectual Property Office, the entire contents of which are hereby incorporated by reference.

BACKGROUND OF THE INVENTION

The present disclosure relates to three-dimensional semiconductor memory devices, and in particular, to three-dimensional semiconductor memory devices with high reliability and high integration density.

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

Some example embodiments of the inventive concepts provide highly-reliable and highly-integrated three-dimensional semiconductor memory devices.

According to an example embodiment of the inventive concepts, a three-dimensional semiconductor memory device includes a peripheral circuit structure on a first substrate, the peripheral circuit structure including peripheral circuits, a second substrate on the peripheral circuit structure, an electrode structure on the second substrate, the electrode structure including a plurality of electrodes that are stacked on the second substrate, and a penetrating interconnection structure penetrating the electrode structure and the second substrate. The penetrating interconnection structure may include a lower insulating pattern, a mold pattern structure on the lower insulating pattern, a protection pattern between the lower insulating pattern and the mold pattern structure, and a penetration plug. The penetration plug may penetrate the mold pattern structure and the lower insulating pattern and may be connected to the peripheral circuit structure. The protection pattern may be at a level lower than that of a lowermost one of the electrodes.

According to an example embodiment of the inventive concepts, a method of fabricating a three-dimensional semiconductor memory device includes forming a second substrate to cover a peripheral circuit structure formed on a first substrate, the second substrate including a first region and a second region, forming a lower insulating pattern on the peripheral circuit structure to penetrate the first region of the second substrate, forming an electrode structure on the second region, the electrode structure including insulating layers and electrodes, the insulating layers and the electrodes being alternately stacked on the second substrate, forming interlayered insulating layers to cover the electrode structure, and forming a penetration plug to penetrate the interlayered insulating layers and the lower insulating pattern and to be electrically connected to the peripheral circuit structure.

According to an example embodiment of the inventive concepts, a three-dimensional semiconductor memory device includes a peripheral circuit structure including peripheral circuits on a first substrate, peripheral circuit lines connected to the peripheral circuits, and peripheral insulating layers covering the peripheral circuit lines, a second substrate on the peripheral circuit structure, an electrode structure including electrodes and insulating layers being alternately stacked on the second substrate, a source structure between the second substrate and the electrode structure, vertical structures penetrating the electrode structure and the source structure, an interlayered insulating layer on the electrode structure, conductive lines on the interlayered insulating layer, and a penetrating interconnection structure penetrating the electrode structure and the second substrate. The penetrating interconnection structure may include a lower insulating pattern, a mold pattern structure on the lower insulating pattern, a protection pattern between the lower insulating pattern and the mold pattern structure, and a penetration plug. The penetration plug may penetrates the mold pattern structure, the protection pattern, and the lower insulating pattern and connects the conductive lines to the peripheral circuit lines. The protection pattern may be at a level lower than a lowermost one of the electrodes.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Some example embodiments of the inventive concepts will now be described more fully with reference to the accompanying drawings, in which example embodiments are shown.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
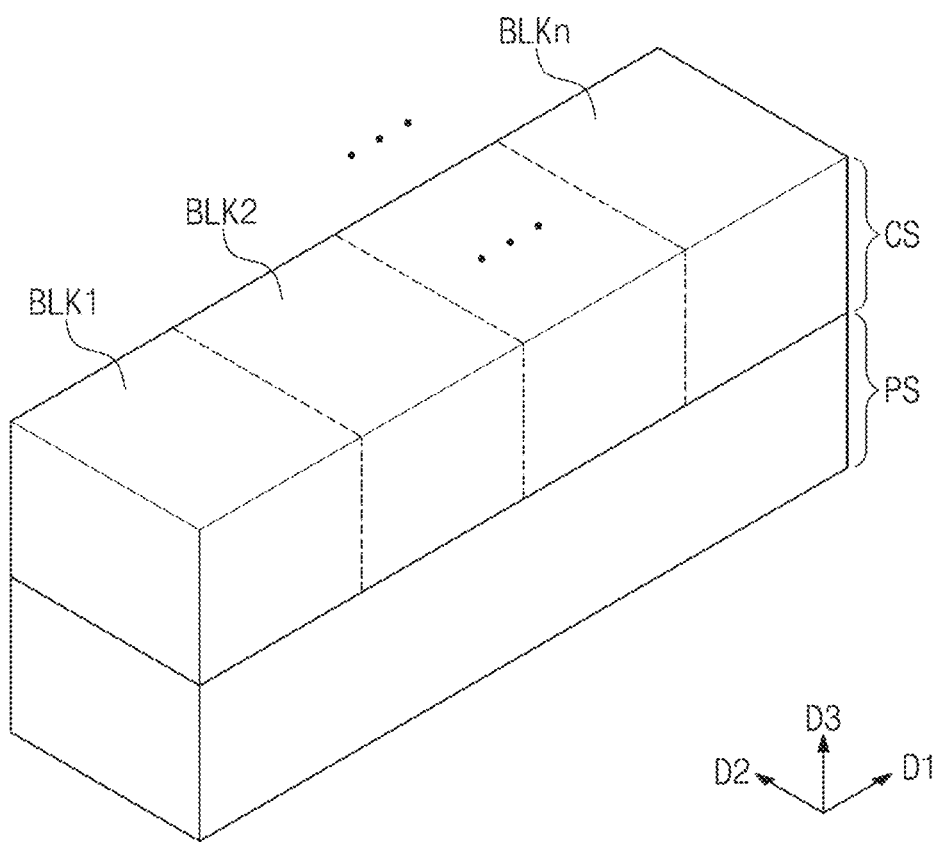
FIG. 1 is a perspective view schematically illustrating a three-dimensional semiconductor memory device, according to an example embodiment of the inventive concepts.

FIG. 1 is a perspective view schematically illustrating a three-dimensional semiconductor memory device, according to an example embodiment of the inventive concepts.

Referring to FIG. 1, the three-dimensional semiconductor memory device may include a peripheral circuit structure PS and a cell array structure CS, which is stacked on the peripheral circuit structure PS. In other words, the peripheral circuit structure PS and the cell array structure CS may be overlapped with each other, when viewed in a plan view.

In an example embodiment, the peripheral circuit structure PS may include, for example, row and column decoders, page buffers, and control circuits, which are used to control or access a cell array of the three-dimensional semiconductor memory device.

The cell array structure CS may include a plurality of memory blocks BLK1-BLKn, and in an example embodiment, an erase operation may be performed on each of the memory blocks BLK1-BLKn. Each of the memory blocks BLK1-BLKn may include a memory cell array having a three-dimensional or vertical structure. The memory cell array may include a plurality of memory cells, which are three-dimensionally arranged, and a plurality of word lines and a plurality of bit lines, which are electrically connected to the memory cells. The three-dimensional structure of the memory cell array will be described in more detail below.

Figure 2:
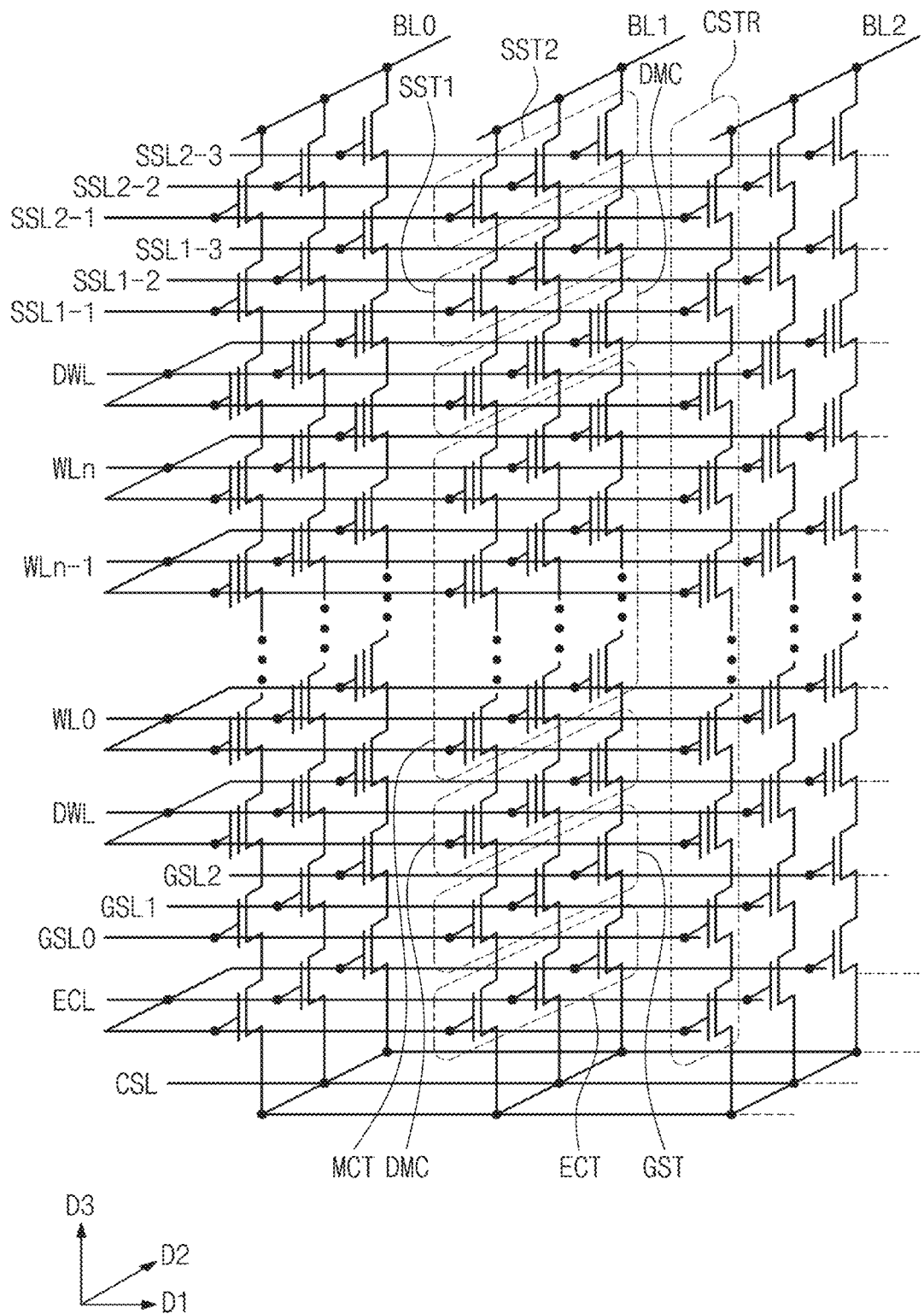
FIG. 2 is a circuit diagram schematically illustrating a cell array of a three-dimensional semiconductor memory device according to an example embodiment of the inventive concepts.

FIG. 2 is a circuit diagram schematically illustrating a cell array of a three-dimensional semiconductor memory device according to an example embodiment of the inventive concepts.

Referring to FIG. 2, the cell array of the three-dimensional semiconductor memory device may include a common source line CSL, a plurality of bit lines BL0-BL2, and a plurality of cell strings CSTR, which are disposed between the common source line CSL and the bit lines BL0-BL2.

The cell strings CSTR may be two-dimensionally arranged in first and second directions D1 and D2, and may be extended in a third direction D3. The bit lines BL0-BL2 may be spaced apart from each other in the first direction D1, and may be extended in the second direction D2.

A plurality of the cell strings CSTR may be connected in parallel to each of the bit lines BL0-BL2. The cell strings CSTR may be connected in common to the common source line CSL. That is, a plurality of the cell strings CSTR may be disposed between the bit lines BL0-BL2 and the single common source line CSL. In an example embodiment, a plurality of common source lines CSL may be two-dimensionally arranged. Here, the common source lines CSL may be applied with the same voltage or electric states of respective ones of the common source lines CSL may be independently controlled.

In an example embodiment, each of the cell strings CSTR may include string selection transistors SST1 and SST2, which are connected in series to each other, memory cell transistors MCT, which are connected in series to each other, a ground selection transistor GST, and an erase control transistor ECT. Each of the memory cell transistors MCT may include a data storage element.

As an example, each of the cell strings CSTR may include first and second string selection transistors SST1 and SST2, which are connected in series, and the second string selection transistor SST2 may be coupled to one of the bit lines BL0-BL2. As another example, each of the cell strings CSTR may include one string selection transistor. As other example, in each of the cell strings CSTR, the ground selection transistor GST may be composed of a plurality of metal-oxide-semiconductor (MOS) transistors, which are connected in series, similar to the first and second string selection transistors SST1 and SST2.

Each of the cell strings CSTR may include a plurality of the memory cell transistors MCT, which are located at different heights from the common source lines CSL. The memory cell transistors MCT may be connected in series, between the first string selection transistor SST1 and the ground selection transistor GST. The erase control transistor ECT may be provided between and connected to the ground selection transistor GST and the common source line CSL. Further, each of the cell strings CSTR may include a first dummy cell transistor DMC provided between and connected to the first string selection transistor SST1 and the uppermost one of the memory cell transistors MCT and a second dummy cell transistor provided between and connected to the ground selection transistor GST and the lowermost one of the memory cell transistors MCT.

In an example embodiment, the first string selection transistor SST1 may be controlled by one of first string selection lines SSL1-1, SSL1-2, and SSL1-3, and the second string selection transistor SST2 may be controlled by one of second string selection lines SSL2-1, SSL2-2, and SSL2-3. The memory cell transistors MCT may be controlled by a plurality of word lines WL0-WLn, respectively, and the dummy cell transistors DMC may be controlled by a dummy word line DWL. The ground selection transistor GST may be controlled by one of ground selection lines GSL0, GSL1, and GSL2, and the erase control transistors ECT may be controlled by an erase control line ECL. The common source line CSL may be connected in common to sources of the erase control transistors ECT.

Gate electrodes of the memory cell transistors MCT, which are located at the same height from the common source lines CSL, may be connected in common to one of the word lines WL0-WLn and may be in an equipotential state. In some example embodiments, even when the gate electrodes of the memory cell transistors MCT are located at the same height from the common source lines CSL, the gate electrodes constituting different rows or columns may be independently controlled.

The ground selection lines GSL0-GSL2, the first string selection lines SSL1-1, SSL1-2, and SSL1-3, and the second string selection lines SSL2-1, SSL2-2, and SSL2-3 may be extended in the first direction D1, and may be spaced apart from each other in the second direction D2. The ground selection lines GSL0-GSL2 (as well as the first string selection lines SSL1-1, SSL1-2, and SSL1-3, and/or the second string selection lines SSL2-1, SSL2-2, and SSL2-3), which are located at substantially the same height from the common source lines CSL, may be electrically separated from each other. Further, the erase control transistors ECT, which are included in different ones of the cell strings CSTR, may be commonly controlled by the erase control line ECL. During an erase operation of the memory cell array, the erase control transistors ECT may cause a gate induced drain leakage (GIDL). In an example embodiment, during the erase operation of the memory cell array, an erase voltage may be applied to the bit lines BL0-BL2 and/or the common source line CSL, and in this case, the gate-induced leakage current may be produced at the string selection transistors SST1 and SST2 and/or the erase control transistor ECT.

Figure 3:
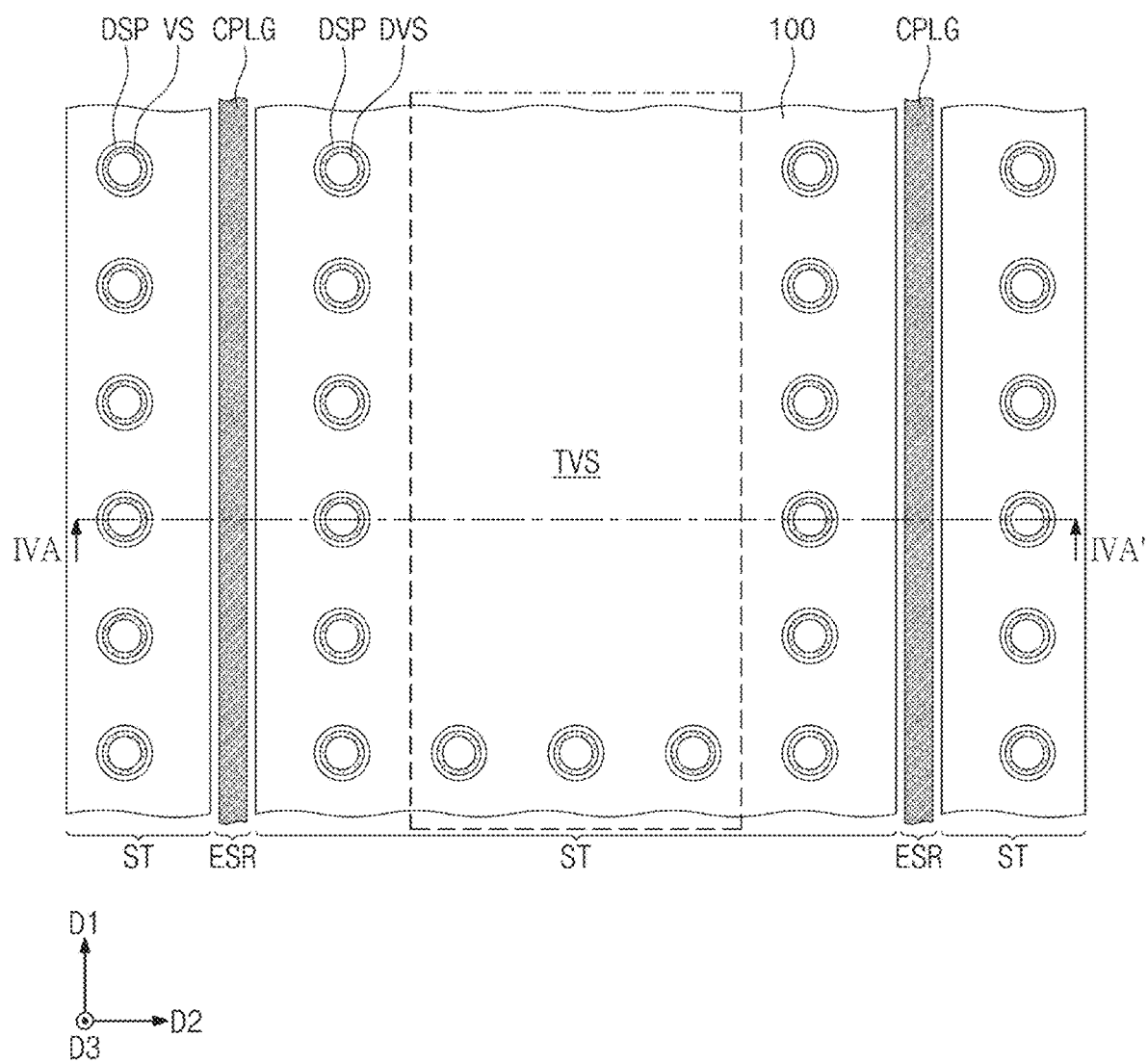
FIG. 3 is a plan view illustrating a three-dimensional semiconductor memory device according to an example embodiment of the inventive concepts.
Figure 4A:
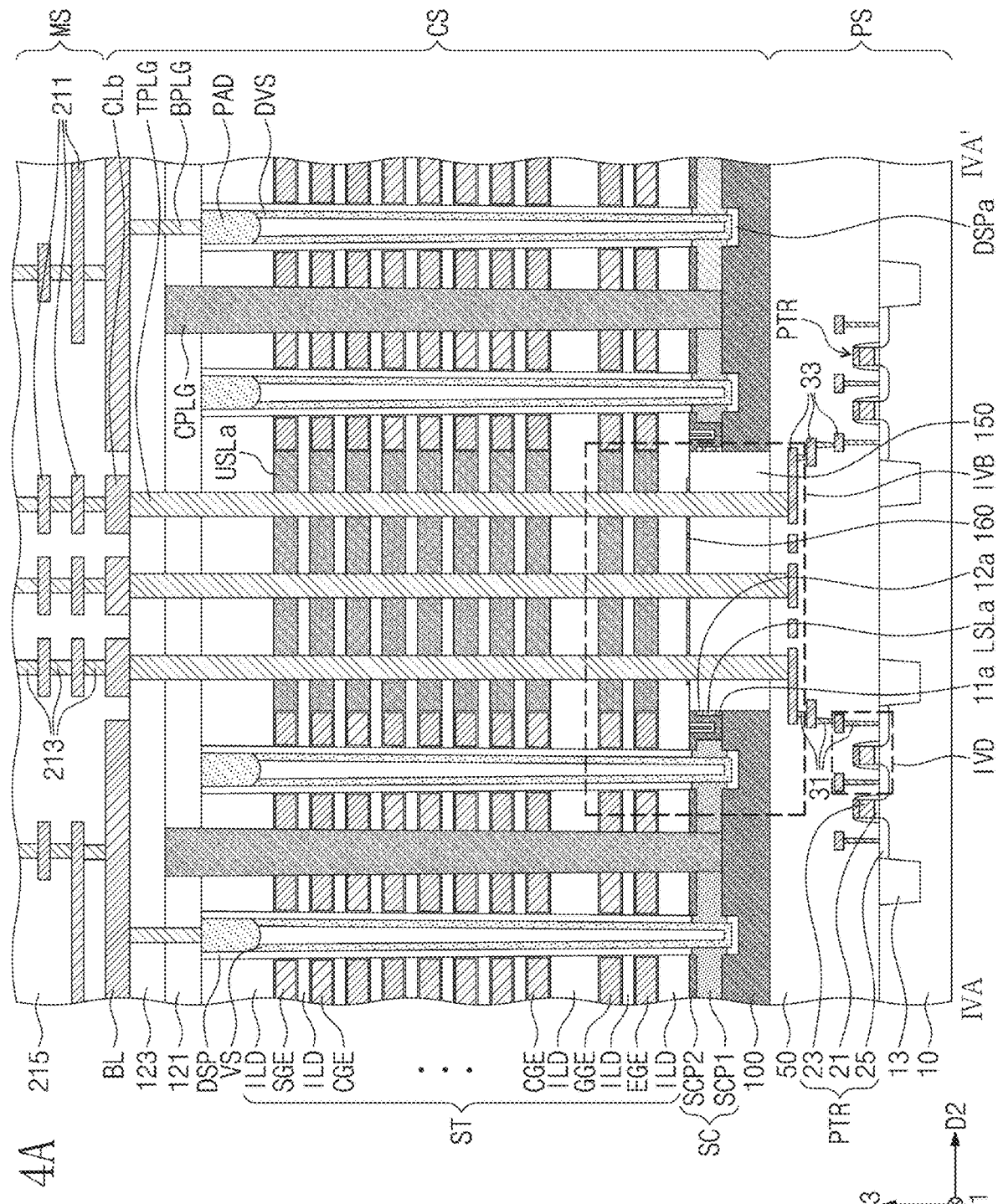
FIG. 4A is a sectional view which is taken along line IVA-IVA' of FIG. 3 to illustrate a three-dimensional semiconductor memory device according to an example embodiment of the inventive concepts.
Figure 4B:
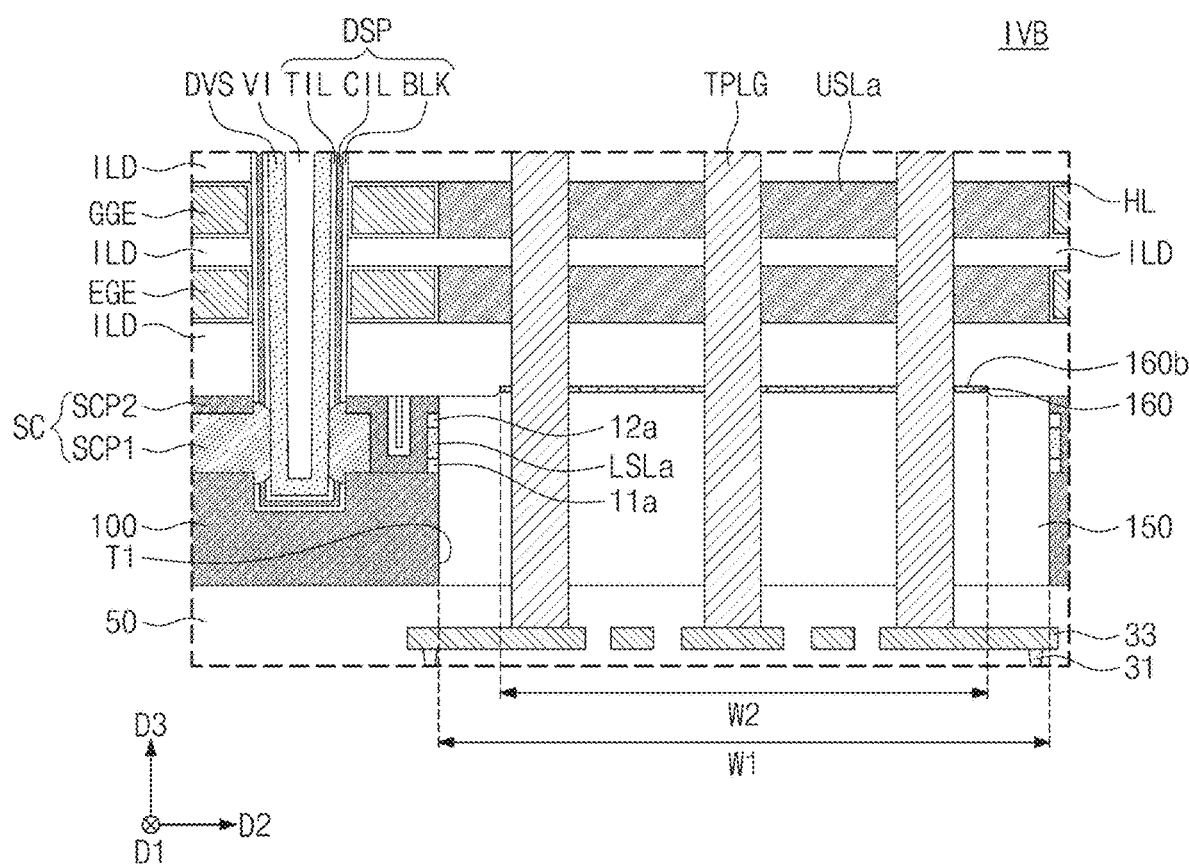
FIGS. 4B and 4C are enlarged sectional views of a portion IVB of FIG. 4A.
Figure 4C:
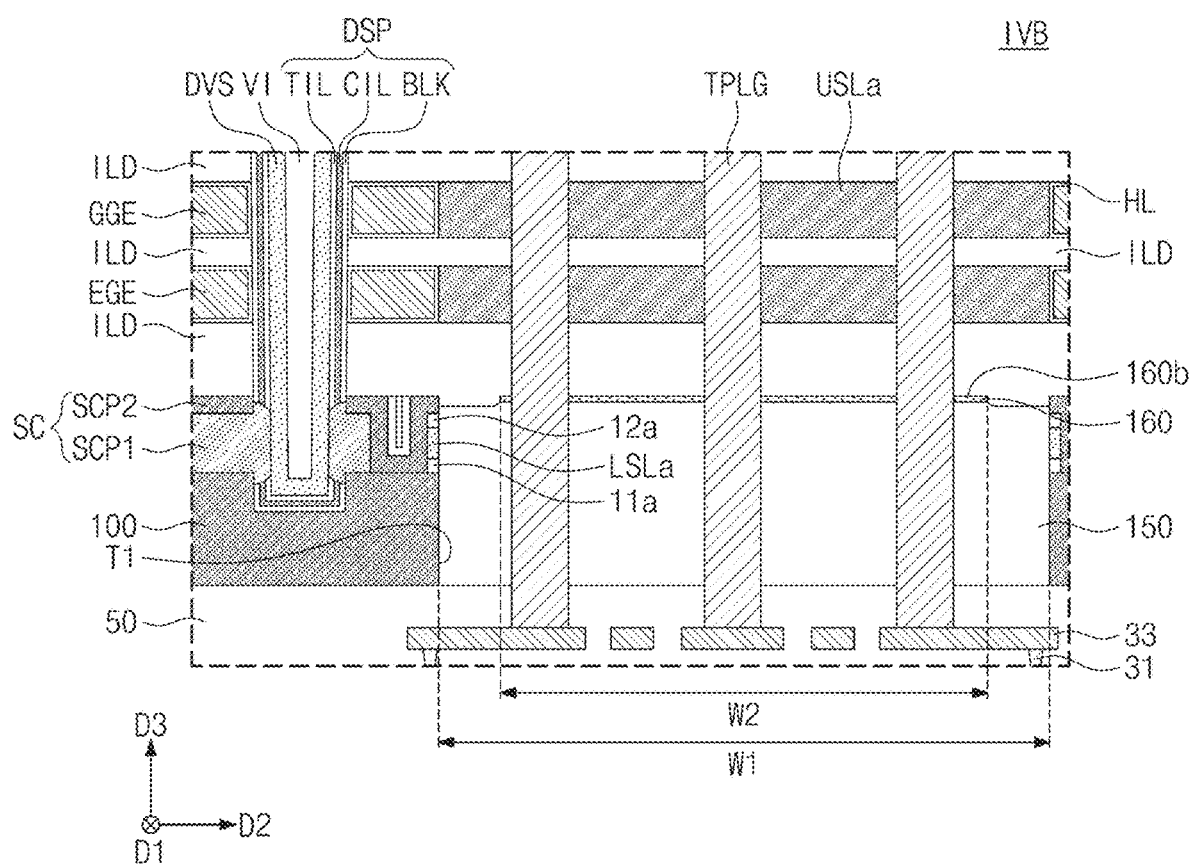
Figure 4D:
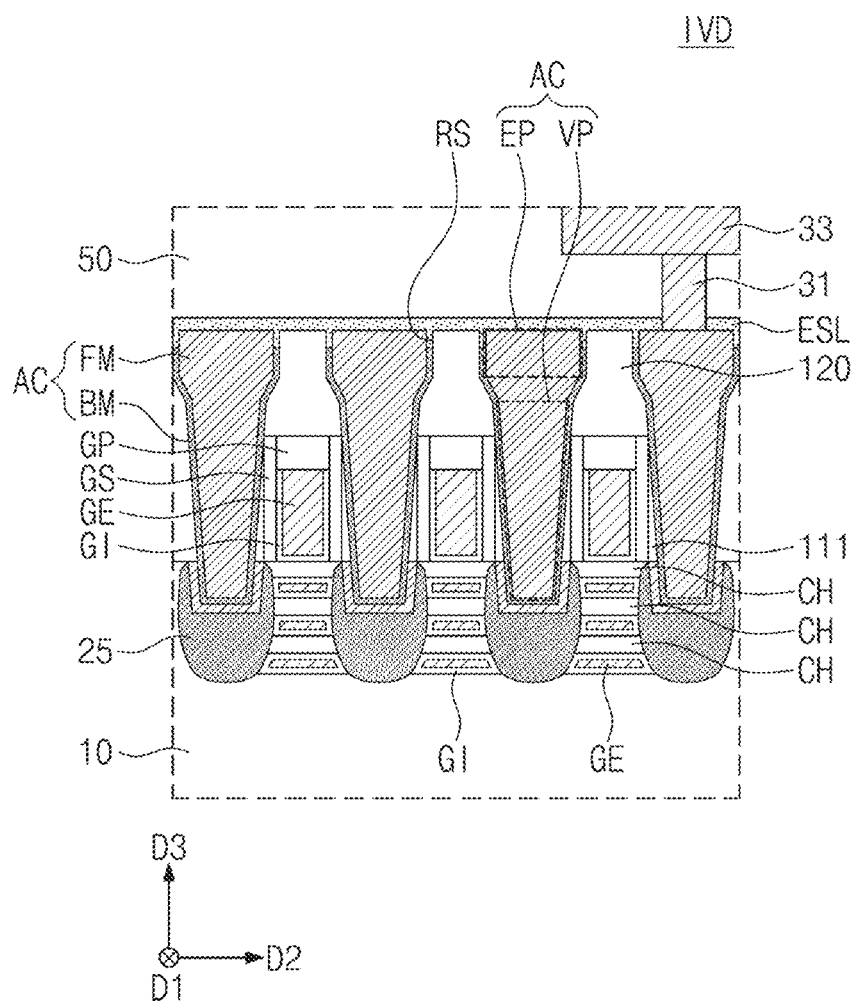
FIG. 4D is an enlarged sectional view exemplarily illustrating a portion of a peripheral circuit (e.g., a portion IVD of FIG. 4A).

FIG. 3 is a plan view illustrating a three-dimensional semiconductor memory device according to an example embodiment of the inventive concepts. FIG. 4A is a sectional view which is taken along line IVA-IVA' of FIG. 3 to illustrate a three-dimensional semiconductor memory device according to an example embodiment of the inventive concepts. FIGS. 4B and 4C are enlarged sectional views of a portion IVB of FIG. 4A. FIG. 4D is an enlarged sectional view exemplarily illustrating a portion of a peripheral circuit (e.g., a portion IVD of FIG. 4A).

Referring to FIGS. 3 and 4A, the three-dimensional semiconductor memory device may include the peripheral circuit structure PS, the cell array structure CS on the peripheral circuit structure PS, and a penetrating interconnection structure TVS penetrating the cell array structure CS.

The peripheral circuit structure PS may include a first substrate 10, peripheral circuits PTR integrated on a top surface of the first substrate 10, and a peripheral insulating layer 50 covering the peripheral circuits PTR. The first substrate 10 may be a silicon substrate, a silicon-germanium substrate, a germanium substrate, or a single crystalline epitaxial layer grown on a single crystalline silicon substrate. The first substrate 10 may have active regions, which are defined by device isolation layers 13.

The peripheral circuits PTR may include, for example, row and column decoders, page buffers, and a control circuit. For example, each of the peripheral circuits PTR may include a peripheral gate insulating layer 21 on the top surface of the first substrate 10, a peripheral gate electrode 23 on the peripheral gate insulating layer 21, and source/drain regions 25, which are provided in portions of the first substrate 10 and at both sides of the peripheral gate electrode 23. Peripheral circuit lines 33 may be electrically connected to the peripheral circuits PTR through peripheral contact plugs 31. For example, the peripheral contact plugs 31 and the peripheral circuit lines 33 may be coupled to NMOS and PMOS transistors constituting the peripheral circuits PTR.

The peripheral insulating layer 50 may be provided on the top surface of the first substrate 10. The peripheral insulating layer 50 may be provided on the first substrate 10 to cover the peripheral circuits PTR, the peripheral contact plugs 31, and the peripheral circuit lines 33. The peripheral insulating layer 50 may include a plurality of sequentially-stacked insulating layers. For example, the peripheral insulating layer 50 may include at least one of a silicon oxide layer, a silicon nitride layer, a silicon oxynitride layer, and/or a low-k dielectric layer.

As another example, the peripheral circuits PTR may include a plurality of first channel patterns CH, source/drain regions 25, a gate electrode GE, and a gate insulating pattern GI, which are provided on the first substrate 10, as shown in FIG. 4D.

The first channel patterns CH may be vertically stacked on the first substrate 10, and may be spaced apart from each other in the third direction D3. The first channel patterns CH may be overlapped with each other, when viewed in a plan view. The first channel patterns CH may be formed of or include at least one of silicon (Si), germanium (Ge), or silicon-germanium (SiGe). The first channel patterns CH may be interposed between each adjacent pair of the source/drain regions 25. The first channel patterns CH, which are stacked on the first substrate 10, may connect the each adjacent pair of the source/drain regions 25. The gate electrode GE may be provided to cross the first channel patterns CH and to extend in the first direction D1. The gate electrode GE may overlap the first channel patterns CH, when viewed in a plan view. A pair of gate spacers GS may be disposed on both side surfaces of the gate electrode GE. A gate capping pattern GP may be provided on the gate electrode GE. The gate dielectric pattern GI may be provided between each of the first channel patterns CH and the gate electrode GE. The gate dielectric pattern GI may surround each of the first channel patterns CH. A first peripheral insulating layer 111 and a second peripheral insulating layer 120 may be provided on the top surface of the first substrate 10. Further, an etch stop layer ESL may be provided on the second peripheral insulating layer 120. Active contacts AC may penetrate the first peripheral insulating layer 111 and the second peripheral insulating layer 120 (in some example embodiments, as well as the etch stop layer ESL), and may be respectively connected to the source/drain regions 25. Each of the active contacts AC may include a conductive pattern FM and a barrier pattern BM enclosing the conductive pattern FM. In an example embodiment, the active contact AC may include an extension portion EP and a penetration portion VP, which is extended from the extension portion EP to the source/drain region 25.

The cell array structure CS may be provided on the peripheral insulating layer 50. The cell array structure CS may include a second substrate 100, a source structure SC, an electrode structure ST, vertical structures, and a data storage pattern DSP.

The second substrate 100 may be disposed on a top surface of the peripheral insulating layer 50. The second substrate 100 may be formed of or include at least one of semiconductor materials (e.g., silicon (Si), germanium (Ge), silicon germanium (SiGe), gallium arsenic (GaAs), indium gallium arsenic (InGaAs), or aluminum gallium arsenic (AlGaAs)). The second substrate 100 may be formed of or include a doped semiconductor material of a first conductivity type (e.g., an n-type) and/or an intrinsic semiconductor material. The second substrate 100 may have at least one of single crystalline, amorphous, or polycrystalline structures.

The second substrate 100 may have a first trench T1. A lower insulating pattern 150, which will be described below, may be formed in the first trench T1.

The source structure SC may be interposed between the electrode structure ST and the second substrate 100. The source structure SC may be extended parallel to the electrode structure ST and in the first direction D1. The source structure SC may include a first source conductive pattern SCP1 and a second source conductive pattern SCP2, which are sequentially stacked on the peripheral insulating layer 50. A thickness of the first source conductive pattern SCP1 may be greater than a thickness of the second source conductive pattern SCP2. The first source conductive pattern SCP1 may be in contact with the second substrate 100, and the second source conductive pattern SCP2 may be in direct contact with the first source conductive pattern SCP1.

The first source conductive pattern SCP1 and the second source conductive pattern SCP2 may be formed of or include a doped semiconductor material, which is doped with dopants such as phosphorus (P) or arsenic (As), and has, for example, the first conductivity type. In an example embodiment, the first source conductive pattern SCP1 and the second source conductive pattern SCP2 may be a semiconductor layer doped with n-type dopants, and in this case, a concentration of the n-type dopants may be higher in the first source conductive pattern SCP1 than in the second source conductive pattern SCP2.

The electrode structure ST may be disposed on the source structure SC. The electrode structure ST may be extended in the first direction D1, and may be disposed between a pair of vertical insulating patterns CPLG, which are extended in the first direction D1. Adjacent ones of the electrode structures ST may be spaced apart from each other, in the second direction D2 crossing the first direction D1, by an electrode separation region ESR provided therebetween. Here, the first and second directions D1 and D2 may be parallel to the top surface of the first substrate 10. The vertical insulating patterns CPLG may be formed of or include at least one of insulating materials. For example, the vertical insulating patterns CPLG may be formed of or include silicon oxide. The electrode structure ST may include electrodes EGE, GGE, CGE, and SGE and insulating layers ILD, which are alternately stacked in the third or vertical direction D3 perpendicular to the first and second directions D1 and D2. The electrodes EGE, GGE, CGE, and SGE may be formed of or include at least one of doped semiconductor (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The insulating layers ILD may be formed of or include a silicon oxide layer and/or a low-k dielectric layer. In an example embodiment, the electrodes EGE, GGE, CGE, and SGE may include an erase control gate electrode EGE adjacent to the source structure SC, a ground selection gate electrode GGE on the erase control gate electrode EGE, a plurality of cell gate electrodes CGE stacked on the ground selection gate electrode GGE, and a string selection gate electrode SGE on the uppermost one of the cell gate electrodes CGE.

The erase control gate electrode EGE may be adjacent to the source structure SC and may be used as gate electrodes of the erase control transistors ECT (e.g., see FIG. 2), which are used to control the erase operation of the memory cell array. In an example embodiment, the erase control gate electrode EGE may be configured to cause the gate-induced drain leakage (GIDL), during the erase operation of the memory cell array. The ground selection gate electrodes GGE may be used as the gate electrodes of the ground selection transistors GST (e.g., see FIG. 2), which are used to control the electric connection between the common source line CSL (e.g., see FIG. 2) and cell vertical structures VS. The cell gate electrodes CGE may be used as the control gate electrodes WL0-WL3 and DWL of the memory cell transistors MCT (e.g., see FIG. 2). The string selection gate electrodes SGE at the uppermost level may be used as the gate electrodes of the string selection transistors SST1 and SST2 of FIG. 2, which are used to control the electric connection between the bit line BL and the cell vertical structures VS. The insulating layers ILD between the cell gate electrodes CGE each may have the same or substantially similar thickness, and the insulating layer ILD between the lowermost one of the cell gate electrodes CGE and the ground selection gate electrode GGE may be thicker than the others of the insulating layers ILD.

Vertical structures may be provided on the second substrate 100. The vertical structures may include a cell vertical structure VS and a dummy vertical structure DVS. In an example embodiment, a plurality of the cell vertical structures VS and a plurality of the dummy vertical structures DVS may be provided. The cell vertical structures VS and the dummy vertical structures DVS may be extended in the third direction D3, and may penetrate the electrode structures ST. A portion of a side surface of each of the cell and dummy vertical structures VS and DVS may be in contact with the source structure SC, and may be electrically connected to the source structure SC. The cell and dummy vertical structures VS and DVS may have bottom surfaces that are located at a level lower than a bottom surface of the first source conductive pattern SCP1.

The cell and dummy vertical structures VS and DVS may be arranged in a specific direction or may be arranged to form a zigzag shape, when viewed in a plan view. In an example embodiment, the dummy vertical structures DVS may be disposed adjacent to the penetrating interconnection structure TVS, which will be again described below. For example, the dummy vertical structures DVS may at least partially enclose the penetrating interconnection structure TVS, when viewed in a plan view.

Each of the cell and dummy vertical structures VS and DVS may be a pipe- or macaroni-shape pattern with closed bottom. The cell and dummy vertical structures VS and DVS may include a semiconductor material (e.g., silicon (Si) or germanium (Ge)). Furthermore, the cell and dummy vertical structures VS and DVS may be formed of a doped or intrinsic semiconductor material. The cell and dummy vertical structures VS and DVS may be formed of a polycrystalline semiconductor material. The cell vertical structures VS may be used as the channel regions of the erase control transistor ECT, the string and ground selection transistors SST and GST, and the memory cell transistors MCT. A conductive bit line pad PAD may be provided on each of the cell vertical structures VS. The conductive bit line pad PAD may be an impurity region doped with impurities or may be formed of a conductive material.

The data storage pattern DSP may be disposed between the electrode structure ST and the cell vertical structures VS and between the electrode structure ST and the dummy vertical structures DVS. The data storage pattern DSP may be extended in the third direction D3, and may be provided to surround a side surface of each of the cell and dummy vertical structures VS and DVS. In other words, the data storage pattern DSP may be a pipe- or macaroni-shape pattern with open top and bottom. In an example embodiment, the data storage pattern DSP may be disposed on the source structure SC.

A lower data storage pattern DSPa may be vertically spaced apart from the data storage pattern DSP, and may be disposed in the second substrate 100. The lower data storage pattern DSPa may have a substantially 'U'-shaped section, and each of the cell and dummy vertical structures VS and DVS may be spaced apart from the second substrate 100 by the lower data storage pattern DSPa.

A first interlayered insulating layer 121 may be disposed on the electrode structure ST, and the vertical insulating patterns CPLG may be provided in the electrode separation regions ESR, respectively. The vertical insulating patterns CPLG may be provided to penetrate the electrode structure ST and the source structure SC, and may be spaced apart from the cell and dummy vertical structures VS and DVS. The vertical insulating patterns CPLG may be formed of or include a silicon oxide layer and/or a low-k dielectric layer. As an example, the vertical insulating patterns CPLG may have a substantially uniform upper width, and may be extended in the first direction D1.

A second interlayered insulating layer 123 may be provided on the first interlayered insulating layer 121. The second interlayered insulating layer 123 may cover a top surface of the vertical insulating pattern CPLG. Bit lines BL extending in the second direction D2 may be provided on the second interlayered insulating layer 123. The bit lines BL may be connected to the conductive bit line pads PAD through bit line contact plugs BPLG. Conductive lines CLb extending in the first direction D1 may be provided on the second interlayered insulating layer 123. The bit lines BL and the conductive lines CLb may be formed of or include a conductive material. For example, the bit lines BL and the conductive lines CLb may be formed of or include at least one of metallic materials (e.g., tungsten, copper, and aluminum).

A metal line layer MS may be provided on the second interlayered insulating layer 123. The metal line layer MS may include metal lines 211, metal vias 213, and an insulating interconnection layer 215. The insulating interconnection layer 215 may hermetically seal or cover the metal lines 211 and the metal vias 213. The metal lines 211 and the metal vias 213 may be connected to the bit lines BL and the conductive lines CLb.

Referring to FIGS. 3, 4A, 4B, and 4C, the penetrating interconnection structure TVS may include a lower insulating pattern 150, a protection pattern 160, a mold pattern structure, and a penetration plug TPLG.

The lower insulating pattern 150 may be provided on the top surface of the peripheral insulating layer 50. For example, the lower insulating pattern 150 may be provided in the first trench T1 to cover bottom and side surfaces of the first trench T1. In an example embodiment, the lower insulating pattern 150 may penetrate the second substrate 100. When viewed in a plan view, the lower insulating pattern 150 may be surrounded by the second substrate 100. A top surface of the lower insulating pattern 150 may be located at the same level as the top surface of the second source conductive pattern SCP2 (e.g., see FIG. 4B) or may be located at a level between the top and bottom surfaces of the second source conductive pattern SCP2 (e.g., see FIG. 4C). A width W1 of the lower insulating pattern 150 may be greater than a width W2 of the protection pattern 160. For example, the width W1 of the lower insulating pattern 150 may range from 1 μm to 100 μm. The lower insulating pattern 150 may be formed of or include silicon oxide.

The protection pattern 160 may be provided on the top surface of the lower insulating pattern 150. The protection pattern 160 may be interposed between the electrode structure ST and the lower insulating pattern 150. For example, the protection pattern 160 may be in direct contact with the top surface of the lower insulating pattern 150 and a bottom surface of the lowermost layer of the insulating layers ILD. A top surface 160b of the protection pattern 160 may be located at a level between a bottom surface of the lowermost electrode of the electrode structure ST and a top surface of the second source conductive pattern SCP2. For example, as shown in FIG. 4C, the top surface of the protection pattern 160 may be located at substantially the same level as the top surface of the second source conductive pattern SCP2. The width W2 of the protection pattern 160 may be smaller than the width W1 of the lower insulating pattern 150. For example, the width W2 of the protection pattern 160 may range from 0.6 μm to 60 μm. The protection pattern 160 may be formed of or include a material different from the lower insulating pattern 150. For example, the protection pattern 160 may be formed of or include a material, which can be etched with a high etch selectivity with respect to the lower insulating pattern 150. For example, in the case where the lower insulating pattern 150 includes silicon oxide, the lower insulating pattern 150 may be formed of or include silicon nitride. The protection pattern 160 may expose a portion of the top surface of the lower insulating pattern 150. A side edge of the protection pattern 160 may be spaced apart from the side surface of the lower insulating pattern 150 by a distance of, for example, 25 μm to 75 μm in the second direction D2.

The mold pattern structure may be provided on the lower insulating pattern 150 and the protection pattern 160. The mold pattern structure may include upper sacrificial patterns USLa and the insulating layers ILD. In an example embodiment, the mold pattern structure may be surrounded by the electrode structure ST, when viewed in a plan view. In certain example embodiments, the mold pattern structure may be disposed between the electrode structures ST, when viewed in a plan view. The insulating layers ILD may be the same as the insulating layers ILD of the electrode structure ST described above. The upper sacrificial patterns USLa may overlap the lower insulating pattern 150 and the protection pattern 160, when viewed in a plan view. Each of the upper sacrificial patterns USLa may be placed at the same level as a corresponding one of the electrodes EGE, GGE, CGE, or SGE of the electrode structure ST. For example, each of the upper sacrificial patterns USLa may be disposed between the insulating layers ILD. The upper sacrificial patterns USLa may be formed of an insulating material that is different from the insulating layers ILD. The upper sacrificial patterns USLa may be formed of a material, which has an etch selectivity with respect to the insulating layers ILD. For example, the upper sacrificial patterns USLa may be formed of or include silicon nitride.

The penetration plug TPLG may be provided to penetrate the mold pattern structure, the protection pattern 160, the lower insulating pattern 150, and an upper portion of the peripheral insulating layer 50. However, in certain example embodiments, the penetration plug TPLG may not penetrate the protection pattern 160, unlike that illustrated in FIG. 4C. For example, in the case where the penetration plug TPLG penetrates an edge portion of the lower insulating pattern 150 in a plan view, the penetration plug TPLG may not penetrate the protection pattern 160 or may penetrate only a portion of the protection pattern 160. The penetration plug TPLG may connect the conductive lines CLb to the peripheral circuit lines 33, and in this case, electrical signals may be exchanged between the peripheral circuit structure PS and the outside through the penetration plug TPLG and the conductive lines CLb. The penetration plug TPLG may be formed of or include at least one of conductive or metallic materials.

Figure 4E:
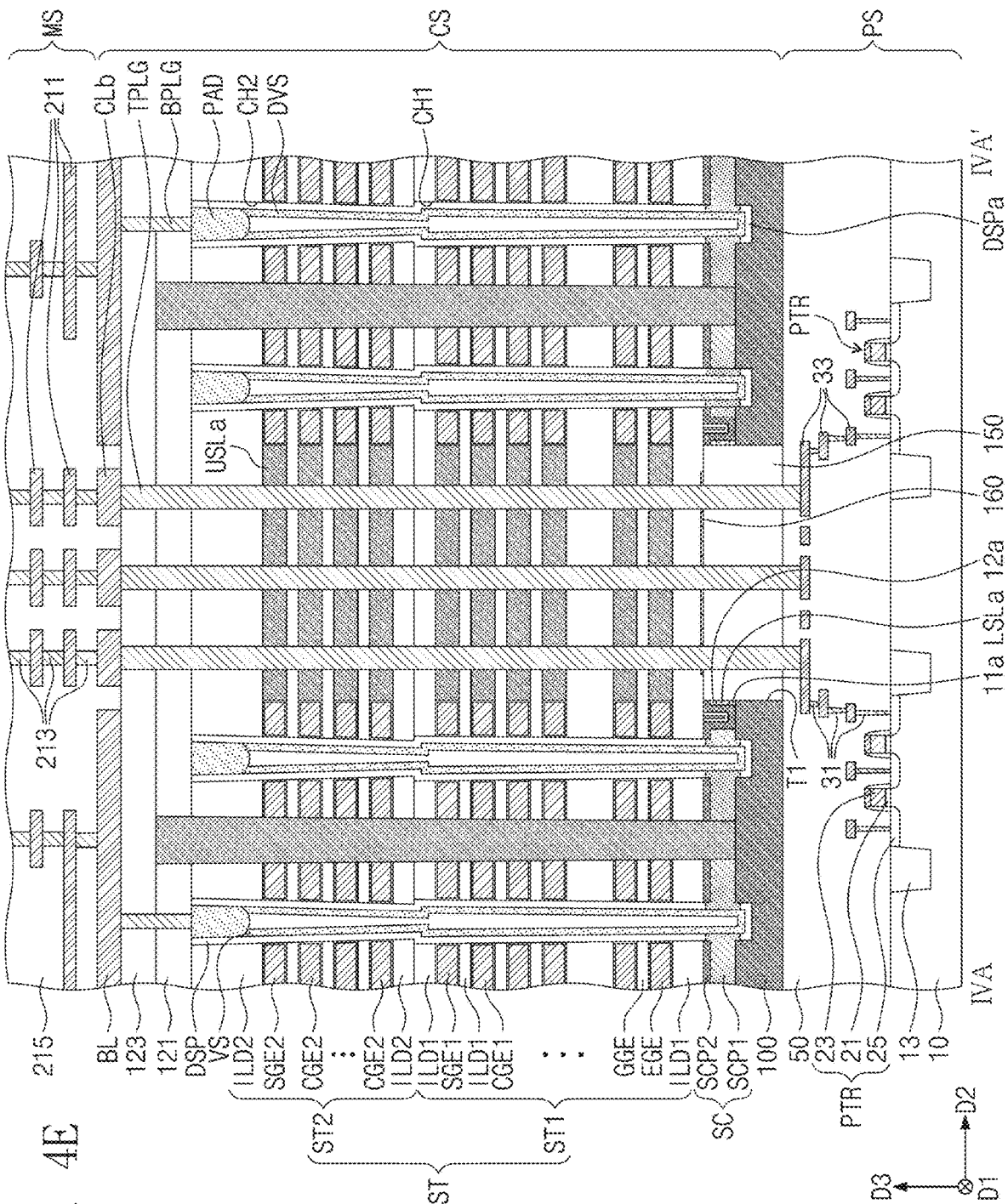
FIG. 4E is a sectional view which is taken along line I-I' of FIG. 3 to illustrate a three-dimensional semiconductor memory device according to an example embodiment of the inventive concepts.

FIG. 4E is a sectional view which is taken along line IVA-IVA' of FIG. 3 to illustrate a three-dimensional semiconductor memory device according to an example embodiment of the inventive concepts. For concise description, an element described above may be identified by the same reference number without repeating an overlapping description thereof.

Referring to FIG. 4E, the three-dimensional semiconductor memory device may include the peripheral circuit structure PS, the cell array structure CS on the peripheral circuit structure PS, and the penetrating interconnection structure TVS penetrating the cell array structure CS. The peripheral circuit structure PS and the penetrating interconnection structure TVS may be configured to have the same or substantially similar features as those described with reference to FIG. 4A to 4C.

In the present example embodiment, the electrode structure ST may include a first electrode structure ST1 and a second electrode structure ST2. The first electrode structure ST1 may be provided on a source structure SC. The first electrode structure ST1 may include electrodes EGE, GGE, CGE1, and SGE1 and first insulating layers ILD1, which are interposed between the electrodes EGE, GGE, CGE1, and SGE1 in the third direction D3. The electrodes EGE, GGE, CGE1, and SGE1 may be the same as or substantially similar to the electrodes EGE, GGE, CGE, and SGE described with reference to FIG. 4A, and the first insulating layers ILD1 may be the same as or substantially similar to the insulating layers ILD.

The second electrode structure ST2 may be provided on the first electrode structure ST1. For example, the second electrode structure ST2 may be provided on a top surface of the uppermost one of the first insulating layers ILD1 of the first electrode structure ST1. Accordingly, the lowermost one of the second insulating layers ILD2 of the second electrode structure ST2 may be in direct contact with the uppermost one of the first insulating layers ILD1. The second electrode structure ST2 may include electrodes CGE2 and SGE2 and second insulating layers ILD2, which are interposed between the electrodes CGE2 and SGE2 in the third direction D3. The electrodes may be the same as of substantially similar to the electrodes EGE, GGE, CGE, and SGE described with reference to FIG. 4A, and the second insulating layers ILD2 may be the same as or substantially similar to the insulating layers ILD.

A first vertical channel CH1 may be provided to penetrate the first electrode structure ST1 and to expose a portion of the second substrate 100. A second vertical channel CH2 may be provided to penetrate the second electrode structure ST2 and to expose the first vertical channel CH1. The first vertical channel CH1 and the second vertical channel CH2 may be connected to each other. A bottom diameter of the second vertical channel CH2 may be smaller than a top diameter of the first vertical channel CH1. The data storage pattern DSP may be provided in the first and second vertical channels CH1 and CH2. The data storage pattern DSP may conformally cover side surfaces of the first and second vertical channels CH1 and CH2. The cell vertical structure VS or the dummy vertical structure DVS may be provided on the data storage pattern DSP.

[Fabrication Method]

FIGS. 5 to 16 are sectional views which are taken along line IVA-IVA' of FIG. 3 to illustrate a method of fabricating a three-dimensional semiconductor memory device, according to an example embodiment of the inventive concepts.

Figure 5:
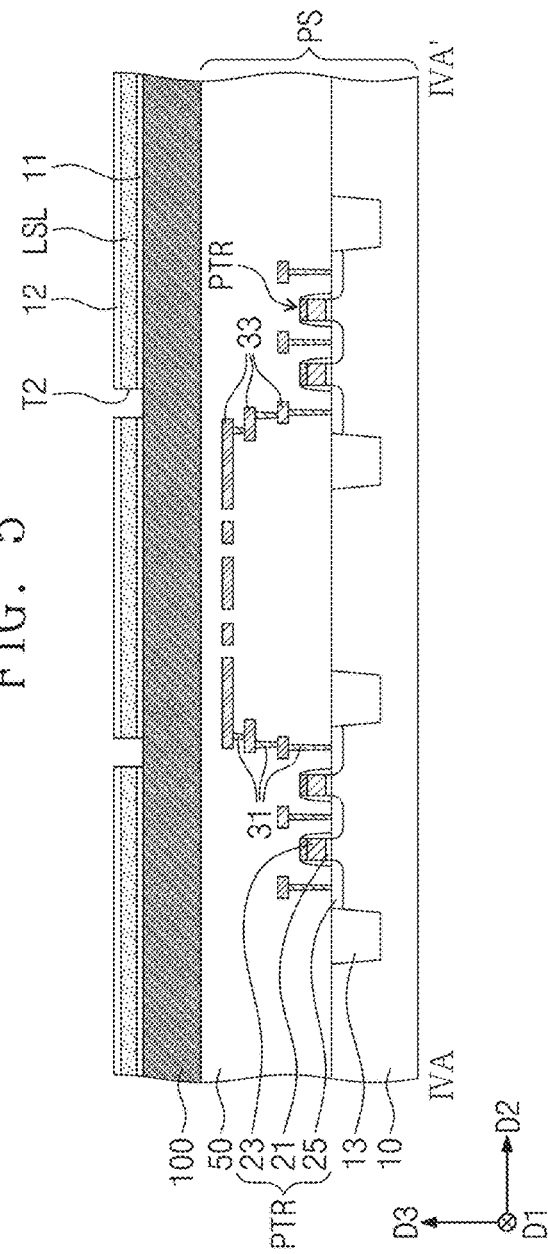
FIGS. 5 to 16 are sectional views which are taken along line IVA-IVA' of FIG. 3 to illustrate a method of fabricating a three-dimensional semiconductor memory device, according to an example embodiment of the inventive concepts.

Referring to FIG. 5, the peripheral circuit structure PS may be formed on the first substrate 10. The first substrate 10 may be a bulk silicon wafer. The device isolation layer 13 may be formed in the first substrate 10 to define active regions ACT.

The formation of the peripheral circuit structure PS may include forming the peripheral circuits PTR on the first substrate 10, forming the peripheral interconnection structures 31 and 33 connected to the peripheral circuits PTR, and forming the peripheral insulating layer 50. Here, the peripheral circuits PTR may include MOS transistors, in which the first substrate 10 are used as channel regions, or three-dimensional field effect transistors (e.g., MBCFETs), in which gate electrodes are provided to three-dimensionally surround channel regions. In an example embodiment, the formation of the peripheral circuits PTR may include forming the device isolation layer 13 in the first substrate 10 to define active regions, sequentially forming the peripheral gate insulating layer 21 and the peripheral gate electrode 23 on the first substrate 10, and injecting impurities into the first substrate 10 to form the source/drain regions 25 at both sides of the peripheral gate electrode 23. Furthermore, peripheral gate spacers may be formed on side surfaces of the peripheral gate electrode 23.

The peripheral insulating layer 50 may include a single insulating layer or a plurality of stacked insulating layers, and may cover the peripheral circuits PTR. The peripheral insulating layer 50 may include, for example, a silicon oxide layer, a silicon nitride layer, a silicon oxynitride layer, and/or a low-k dielectric layer.

The formation of the peripheral interconnection structures 31 and 33 may include forming the peripheral contact plugs 31 to penetrate portions of the peripheral insulating layer 50 and forming the peripheral circuit lines 33 connected to the peripheral contact plugs 31.

The second substrate 100 may be formed by depositing a semiconductor material on the peripheral insulating layer 50. The second substrate 100 may be formed of or include at least one of semiconductor materials (e.g., silicon (Si), germanium (Ge), silicon germanium (SiGe), gallium arsenic (GaAs), indium gallium arsenic (InGaAs), or aluminum gallium arsenic (AlGaAs)). The second substrate 100 may be formed of or include a doped semiconductor material and/or an intrinsic semiconductor material. The second substrate 100 may have at least one of single crystalline, amorphous, or polycrystalline structures.

A first buffer insulating layer 11 may be formed on the second substrate 100. The first buffer insulating layer 11 may be formed by thermally oxidizing a surface of the second substrate 100 or by depositing a silicon oxide layer. A lower sacrificial layer LSL may be formed on the first buffer insulating layer 11. The lower sacrificial layer LSL may be formed of or include a material having an etch selectivity with respect to the first buffer insulating layer 11. In an example embodiment, the lower sacrificial layer LSL may be formed of or include at least one of silicon nitride, silicon oxynitride, silicon carbide, or silicon germanium. A second buffer insulating layer 12 may be deposited on the lower sacrificial layer LSL to a uniform thickness. The second buffer insulating layer 12 may be a silicon oxide layer.

Figure 6:
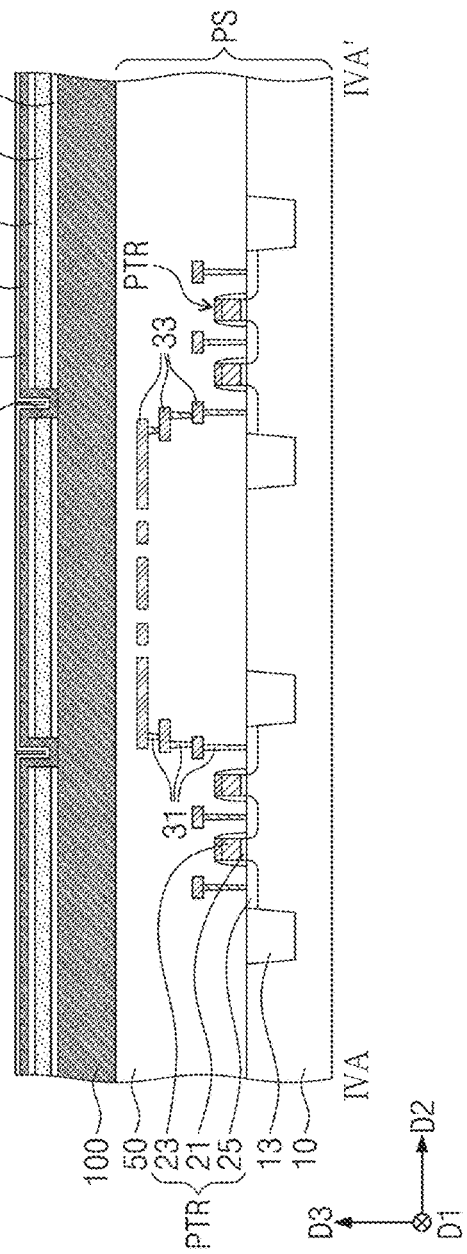

The first buffer insulating layer 11, the second buffer insulating layer 12, and the lower sacrificial layer LSL may be etched to form a second trench T2. The second trench T2 may expose a portion of a top surface of the second substrate 100. Referring to FIG. 6, after the formation of the second trench T2, each of a source conductive layer SCP and a third buffer insulating layer 14 may be deposited on the second buffer insulating layer 12 to a uniform thickness. The source conductive layer SCP and the third buffer insulating layer 14 may fill an inner space of the second trench T2. In an example embodiment, the third buffer insulating layer 14 may be a silicon oxide layer, and the source conductive layer SCP may be a poly-silicon layer that is doped with n-type dopants and/or carbon (C).

Figure 7:
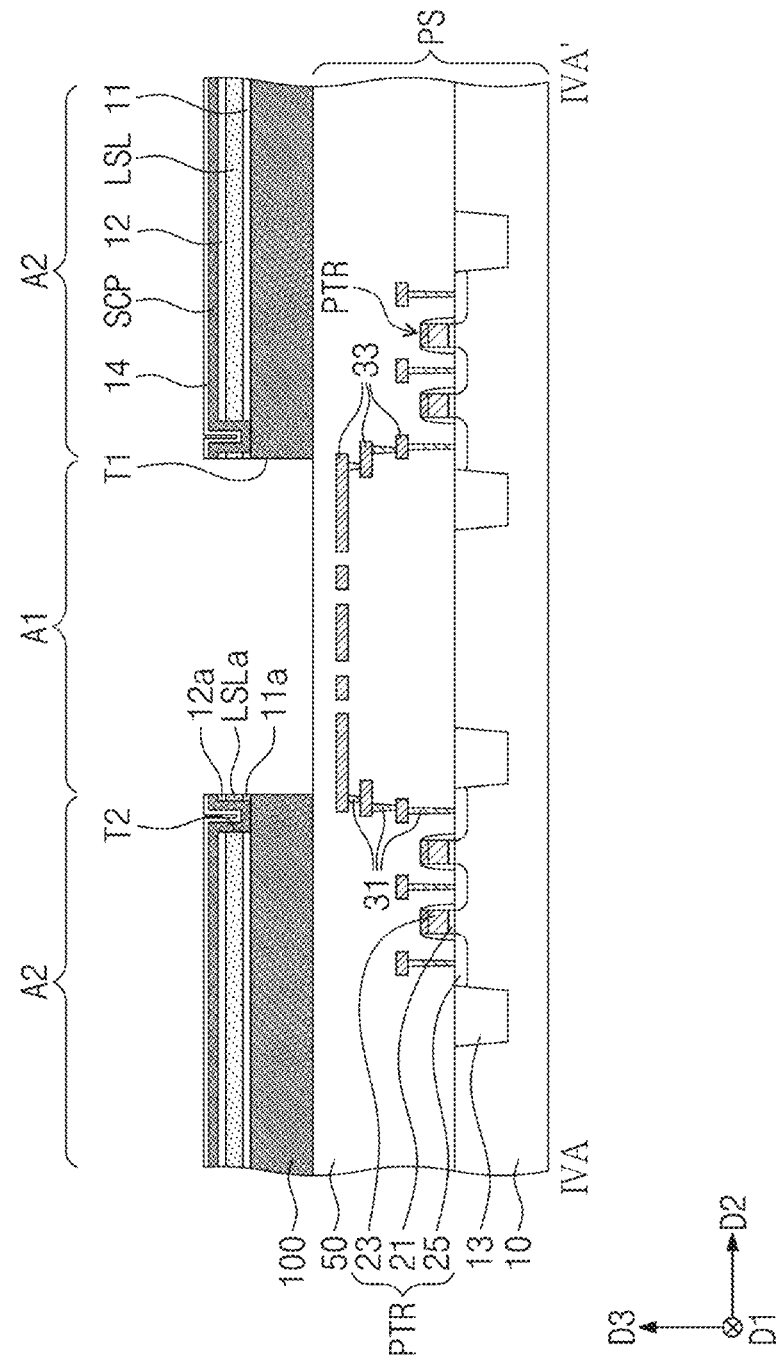

Referring to FIG. 7, the three-dimensional semiconductor memory device may include a first region A1, in which the penetrating interconnection structure TVS will be formed, and a second region A2 provided outside or around the first region A1. The first trench T1 may be formed by etching the second substrate 100, the first buffer insulating layer 11, the lower sacrificial layer LSL, the second buffer insulating layer 12, the source conductive layer SCP, and the third buffer insulating layer 14 on a first region A1. The first trench T1 may expose the top surface of the peripheral insulating layer 50. The first trench T1 may expose side surfaces of the second substrate 100, the first buffer insulating layer 11, the lower sacrificial layer LSL, the source conductive layer SCP, the second buffer insulating layer 12, and the third buffer insulating layer 14. The first trench T1 may be spaced apart from the second trench T2 in the first or second direction D1 or D2. A first buffer pattern 11a, a lower sacrificial pattern LSLa, and a second buffer pattern 12a may be disposed between the first trench T1 and the second trench T2.

Figure 8:
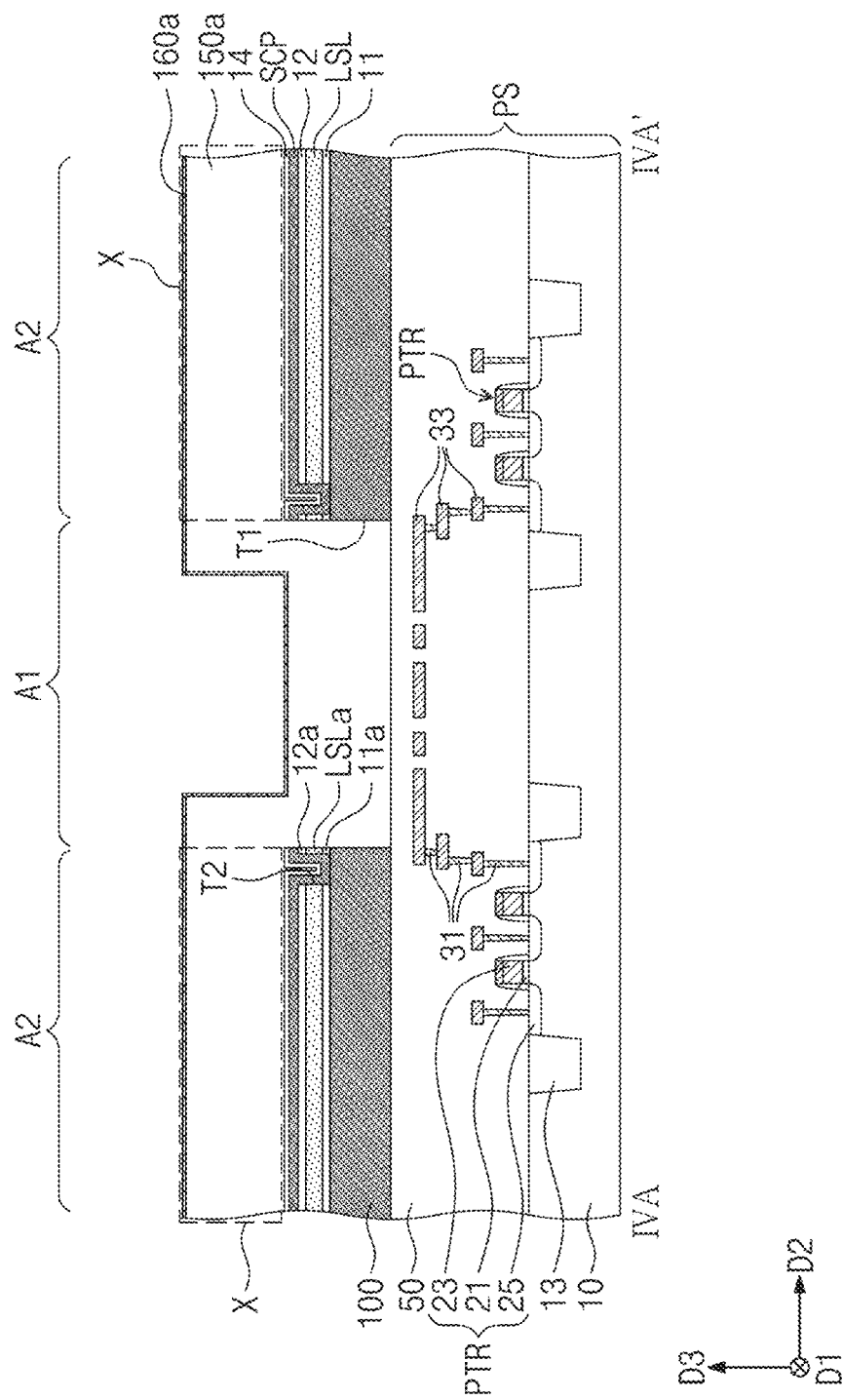

Referring to FIG. 8, a lower insulating layer 150a and a protection layer 160a may be deposited on a top surface of the third buffer insulating layer 14, after the formation of the first trench T1. The lower insulating layer 150a may cover the top surface of the third buffer insulating layer 14 and to fill the first trench T1. The lower insulating layer 150a may be a silicon oxide layer. The protection layer 160a may be formed on the lower insulating layer 150a. The protection layer 160a may conformally cover a top surface of the lower insulating layer 150a. The protection layer 160a may be a silicon nitride layer. A thickness of the protection layer 160a may range from 1000 Å to 2000 Å.

Figure 9:
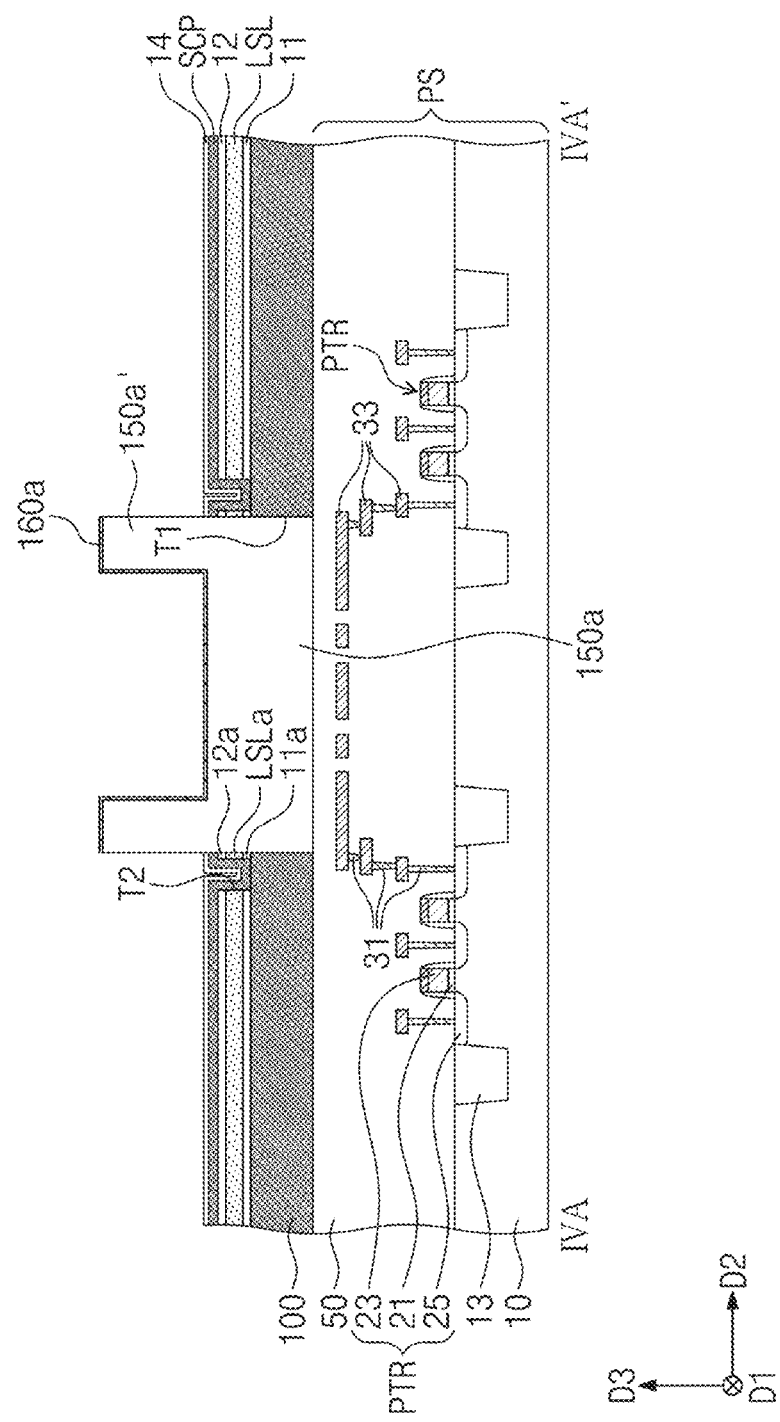

Referring to FIGS. 8 and 9, a dry etching process may be performed to remove a portion of the lower insulating layer 150a and a portion of the protection layer 160a from a second region A2. For example, portions (e.g., X of FIG. 8) of the lower insulating layer 150a and the protection layer 160a may be removed from the second region A2. Accordingly, the top surface of the third buffer insulating layer 14 may be exposed to the outside, and the lower insulating layer 150a may have a protruding portion 150a' adjacent to the side surface of the first trench T1. The protection layer 160a may cover the top surface of the protruding portion 150a' and portions of the side surfaces of the protruding portion 150a'.

Figure 10:
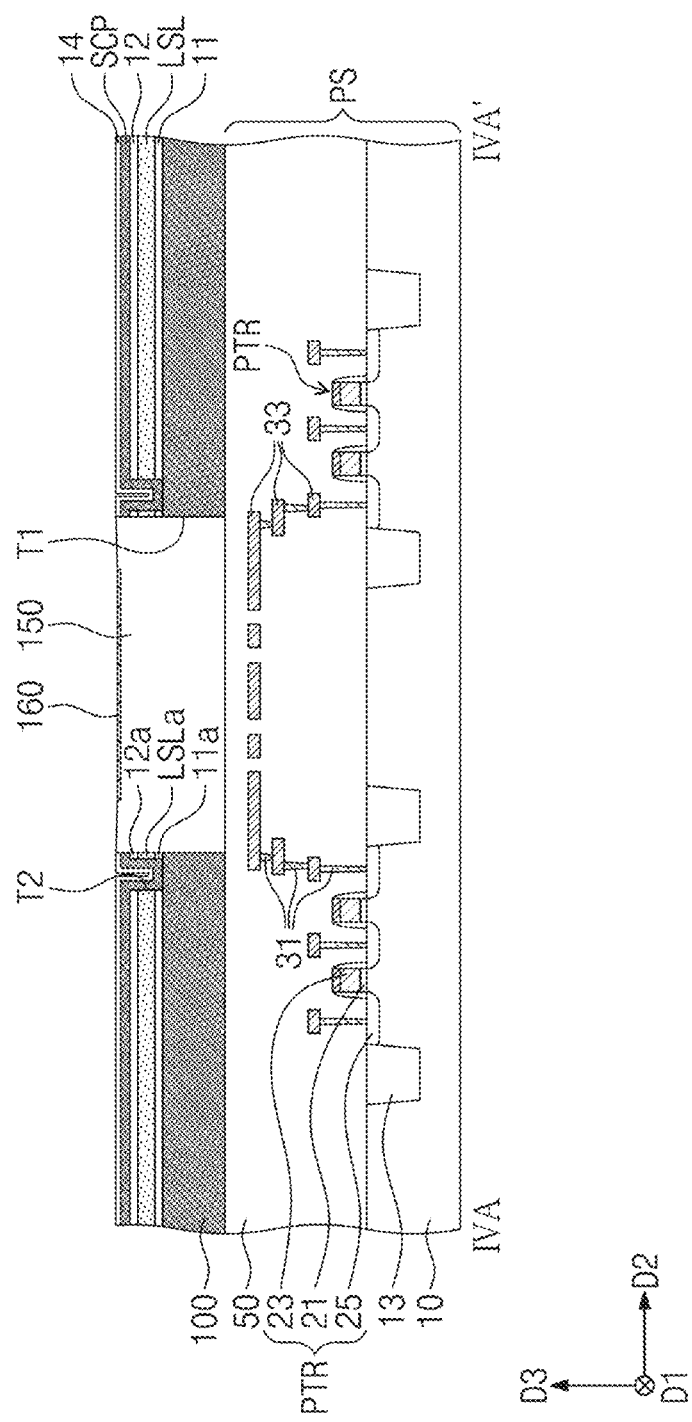

Referring to FIG. 10, a chemical mechanical polishing process may be performed to remove the protruding portion 150a' of the lower insulating layer 150a and a portion of the protection layer 160a on the protruding portion 150a'. In an example embodiment, a first polishing process may be performed to remove a portion of the protruding portion 150a' of the lower insulating layer 150a. Thereafter, a second polishing process may be performed to remove the remaining portion of the protruding portion 150a'. Thus, the lower insulating pattern 150 and the protection pattern 160 may be formed. The lower insulating pattern 150 may have a top surface that is coplanar with the top surface of the third buffer insulating layer 14. The protection pattern 160 may cover a portion of the top surface of the lower insulating pattern 150. The protection pattern 160 may have a width smaller than a width of the lower insulating pattern 150. That is, the protection pattern 160 may expose a portion of the top surface of the lower insulating pattern 150. Although not shown, when the second polishing process is overly performed, the entirety of the protection layer 160a may be removed, and in this case, the protection pattern 160 may not be left on the lower insulating pattern 150.

Figure 11:
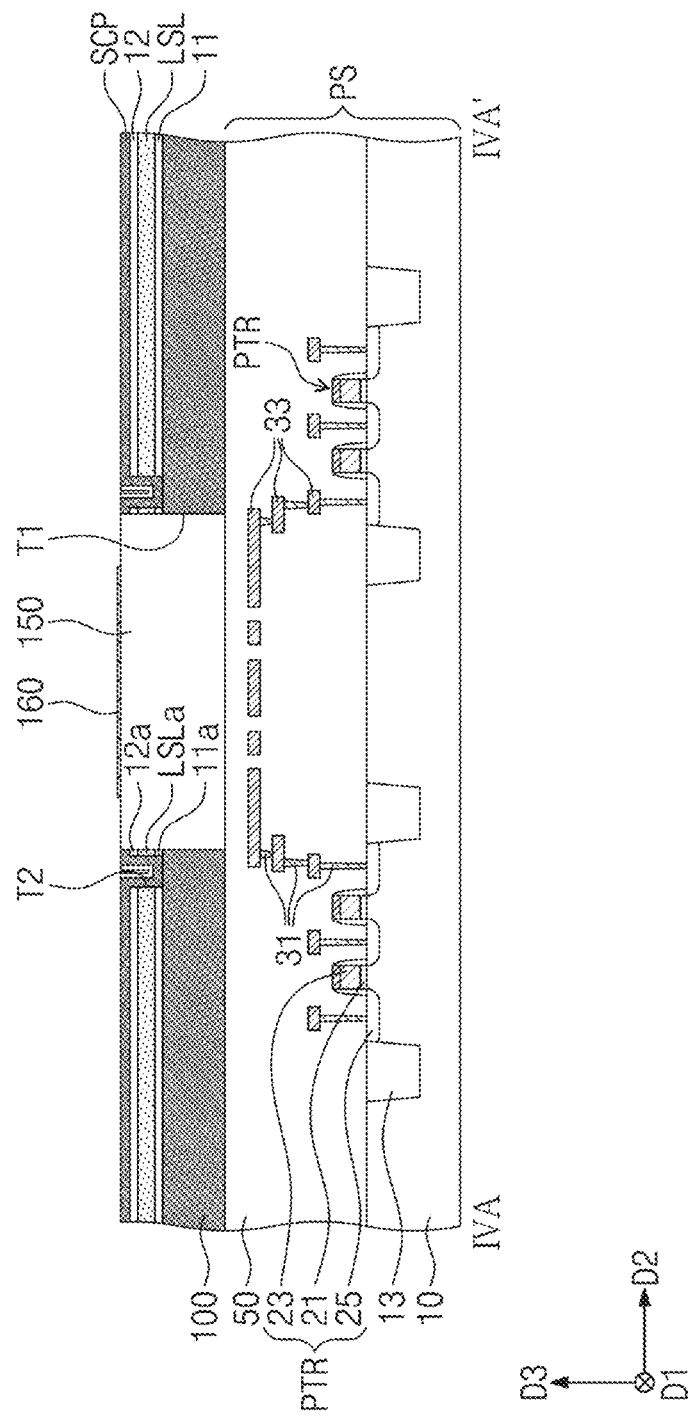

Referring to FIG. 11, a wet etching process may be performed to remove the third buffer insulating layer 14 and an upper portion of the lower insulating pattern 150. For example, in the wet etching process, a ratio (i.e., etch selectivity) of silicon oxide to silicon nitride may range from 1:1 to 1:1000. The third buffer insulating layer 14 and the lower insulating pattern 150 may be formed of or include a material having the etch selectivity with respect to the protection pattern 160. In an embodiment, the wet etching process may be performed to etch the third buffer insulating layer 14 and the upper portion of the lower insulating pattern 150, while mitigating or preventing the protection pattern 160 and the source conductive layer SCP from being etched. Accordingly, the top surface of the source conductive layer SCP may be exposed to the outside. The top surface of the lower insulating pattern 150 may be located at a lower level than (preferably, at the same level as) the top surface of the source conductive layer SCP.

Figure 12:
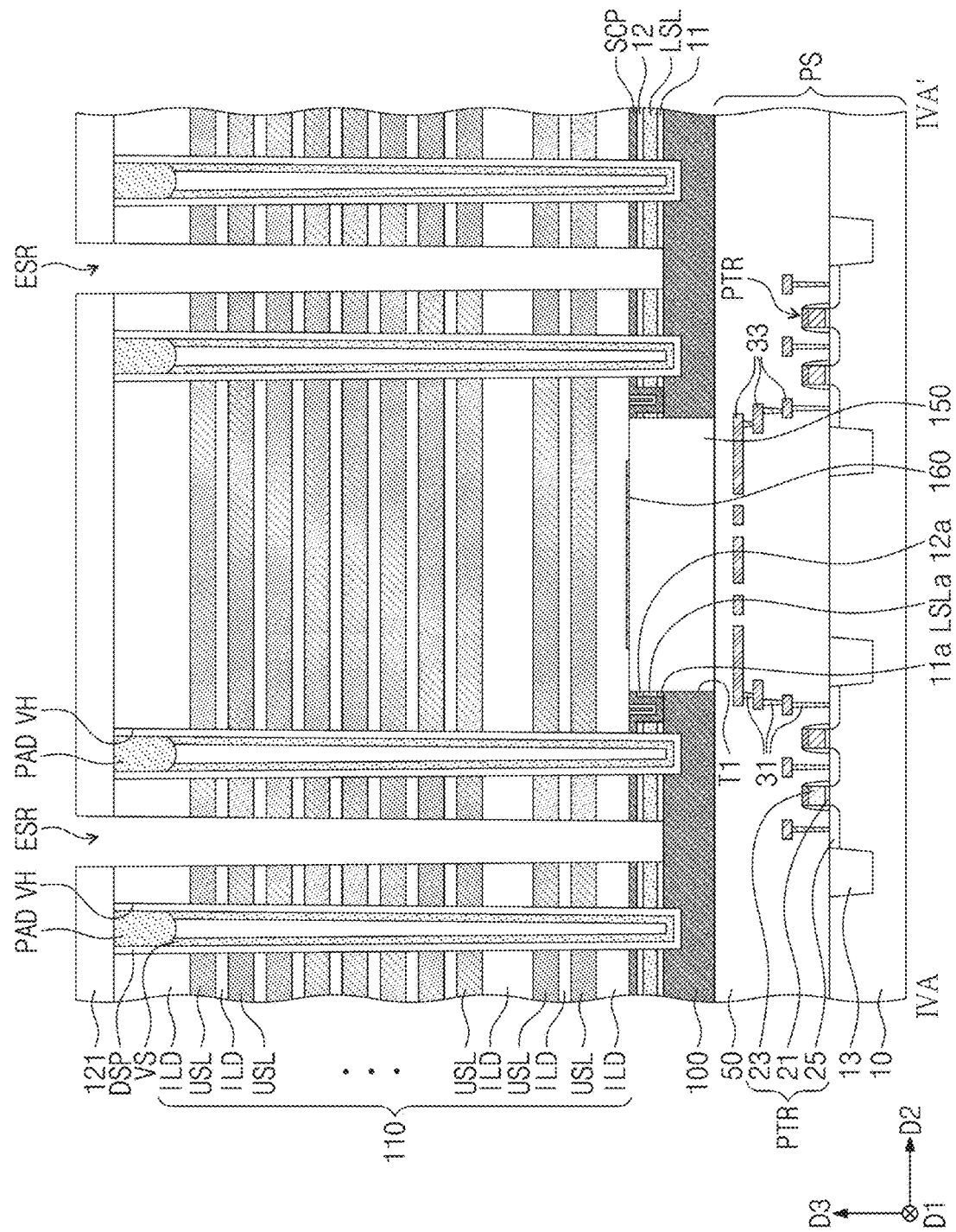

Referring to FIG. 12, a mold structure 110 may be formed on the source conductive layer SCP, and the mold structure 110 may include upper sacrificial layers USL and the insulating layers ILD, which are alternately stacked on the source conductive layer SCP. In the mold structure 110, the upper sacrificial layers USL may be formed of a material, which has an etch selectivity with respect to the insulating layers ILD. As an example, the upper sacrificial layers USL may be formed of an insulating material different from the insulating layers ILD. In an example embodiment, the upper sacrificial layers USL may be formed of the same material as the lower sacrificial layer LSL. For example, the upper sacrificial layers USL may be formed of silicon nitride, and the insulating layers ILD may be formed of silicon oxide. Each of the upper sacrificial layers USL may have the same or substantially similar thickness, and at least one of the insulating layers ILD may have a thickness different from the others.

Referring again to FIG. 12, vertical structures may penetrate the mold structure 110. The formation of the vertical structures may include forming vertical holes VH to penetrate the mold structure 110, forming a data storage pattern DSP in each of the vertical holes VH, and forming the cell vertical structure VS or the dummy vertical structure DVS on the data storage pattern DSP.

The formation of the vertical holes VH may include forming a hard mask pattern (not shown) on the mold structure 110 and anisotropically etching the mold structure 110, the source conductive layer SCP, the first buffer insulating layer 11, the lower sacrificial layer LSL, and the second buffer insulating layer 12 using the hard mask pattern (not shown) as an etch mask. The anisotropic etching step may be performed in an over-etch manner to expose the top surface of the second substrate 100, and in this case, a top surface of the second substrate 100 exposed through the vertical holes VH may be recessed to a specific depth. The vertical hole VH may be formed such that its bottom width is smaller than its upper width.

The data storage pattern DSP may be deposited to cover inner surfaces of the vertical holes VH, and then, the cell vertical structure VS or the dummy vertical structure DVS may be sequentially deposited on the data storage pattern DSP. The data storage pattern DSP and the cell vertical structure VS may define an empty space in each vertical hole VH, and the empty space may be filled with an insulating material VI. The data storage pattern DSP may cover the inner surfaces of the vertical holes VH conformally (e.g., to a uniform thickness). The data storage pattern DSP may include a tunneling insulating layer TIL, a charge storing layer CIL, and a blocking insulating layer BLK, as illustrated in FIG. 4B, which are sequentially stacked on the inner surfaces of the vertical holes VH. The formation of the cell and dummy vertical structures VS and DVS may include conformally depositing a semiconductor layer on the data storage layer DSL using a chemical vapor deposition (CVD) or atomic layer deposition (ALD) process and planarizing the semiconductor layer. The cell and dummy vertical structures VS and DVS may be formed of or include of a doped or intrinsic semiconductor material.

The conductive bit line pads PAD may be formed on the cell and dummy vertical structures VS and DVS. The conductive bit line pads PAD may be an impurity region or may be formed of or include a conductive material. Bottom surfaces of the conductive bit line pads PAD may be located at a level higher than a top surface of the uppermost one of the upper sacrificial layers USL. The first interlayered insulating layer 121 may be formed on the mold structure 110 to cover the conductive bit line pads PAD, after the formation of the conductive bit line pads PAD.

Figure 13:
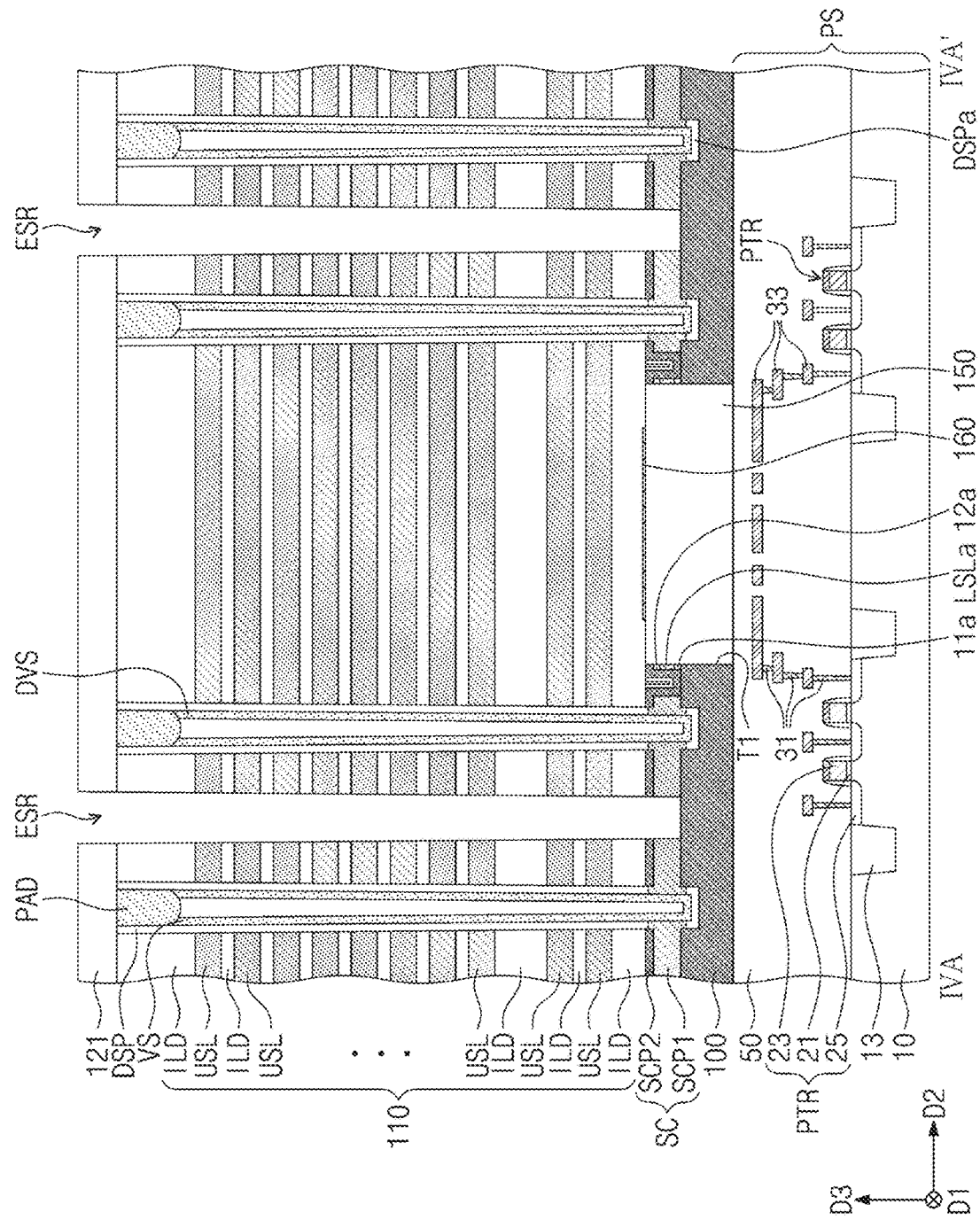

Referring to FIGS. 12 and 13, the source structure SC may be formed between the second substrate 100 and the mold structure 110. The formation of the source structure SC may include replacing the lower sacrificial layer LSL with the first source conductive pattern SCP1. For example, the formation of the source structure SC may include forming the electrode separation regions ESR to expose the top surface of the second substrate 100 and performing an isotropic etching process on the exposed lower sacrificial layer LSL to form a horizontal recess region (not shown) exposing a portion of the data storage pattern DSP. The horizontal recess region may be an empty space between the second source conductive pattern SCP2 and the second substrate 100. The horizontal recess region may be horizontally extended from the electrode separation regions ESR into a region between the second source conductive pattern SCP2 and the second substrate 100. The isotropic etching process may be performed using an etch recipe chosen to have an etch selectivity with respect to the first buffer insulating layer 11, the data storage layer DSL, and the second buffer insulating layer 12. In the case where lower sacrificial layer LSL includes a silicon nitride layer or a silicon oxynitride layer, the etching process on the lower sacrificial layer LSL may be performed using an etching solution containing phosphoric acid. The first source conductive pattern SCP1 may be in direct contact with a portion of the side surface of the cell vertical structure VS, as described above. When the first source conductive pattern SCP1 is formed, the first buffer insulating layer 11 under the lower sacrificial layer LSL may be partially removed, and in this case, the first source conductive pattern SCP1 may be in contact with the second substrate 100. In certain example embodiments, the first buffer insulating layer 11 may be left on the second substrate 100, when the first source conductive pattern SCP1 is formed. In an example embodiment, the electrode separation regions ESR may have a line shape extending in the first direction D1.

Figure 14:
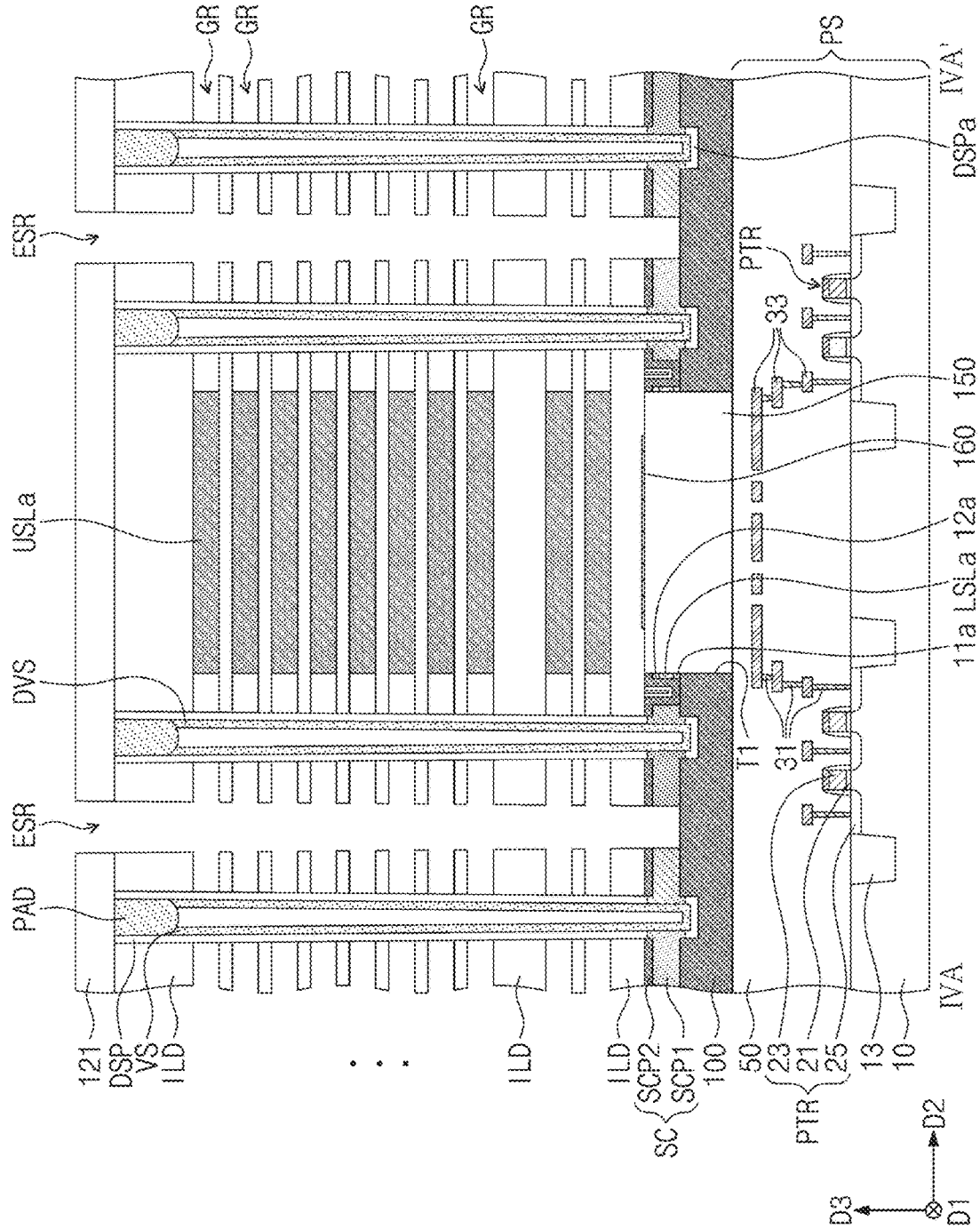
Figure 15:
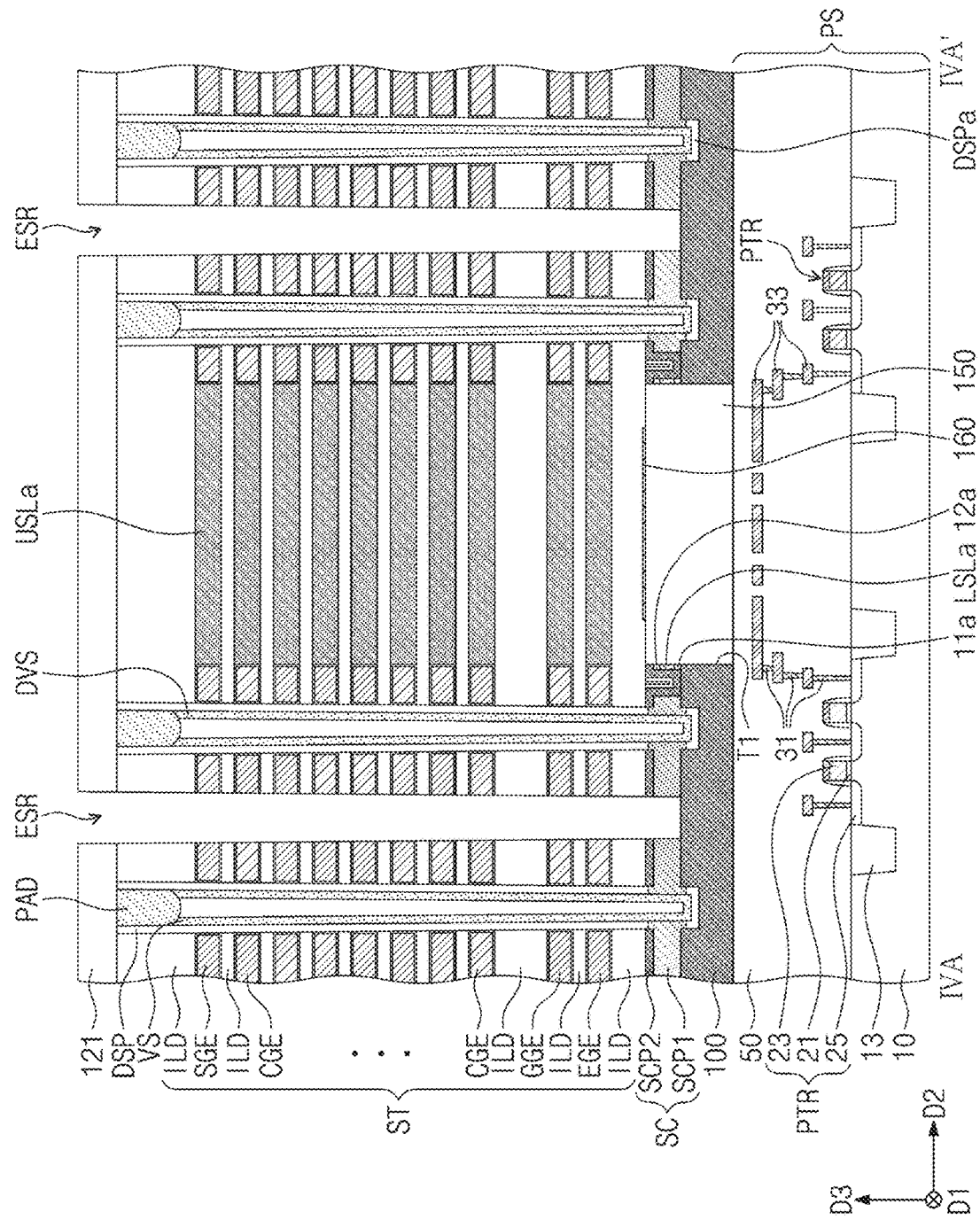

Referring to FIGS. 14 and 15, after the formation of the source structure SC, the upper sacrificial layers USL may be replaced with the electrodes EGE, GGE, CGE, and SGE, and thus the electrode structure ST described above may be formed in the mold structure 110. For example, the upper sacrificial layers USL, which are exposed through the electrode separation regions ESR, may be partially removed to form gate regions GR and upper sacrificial patterns USLa between the insulating layers ILD, as shown in FIG. 14. The upper sacrificial pattern USLa may be an unremoved portion of the upper sacrificial layer USL left between the insulating layers ILD. The gate regions GR may be formed by isotropically etching the upper sacrificial layers USL using an etch recipe having an etch selectivity with respect to the insulating layers ILD, the data storage pattern DSP, and the first and second source conductive patterns SCP1 and SCP2. In this case, each of the gate regions GR may be horizontally extended from the electrode separation region ESR to expose a portion of the side surface of the data storage pattern DSP and a side surface of the upper sacrificial pattern USLa.

A horizontal insulating pattern HL (e.g., see FIG. 4B) may conformally cover inner surfaces of the gate regions GR. The horizontal insulating pattern HL may have a substantially uniform thickness on the inner surfaces of the gate regions GR. The electrodes EGE, GGE, CGE, and SGE may fill the gate regions GR provided with the horizontal insulating pattern HL. The electrodes EGE, GGE, CGE, and SGE may partially or completely fill the gate regions GR. In an example embodiment, the formation of the electrodes EGE, GGE, CGE, and SGE may include sequentially depositing a metal nitride layer (e.g., of TiN, TaN, or WN) and a metal layer (e.g., of W, Al, Tl, Ta, Co, or Cu). Next, the metal nitride layer and the metal layer may be removed from the electrode separation regions ESR, and thus, the electrodes EGE, GGE, CGE, and SGE may be locally formed in the gate regions GR, respectively.

Figure 16:
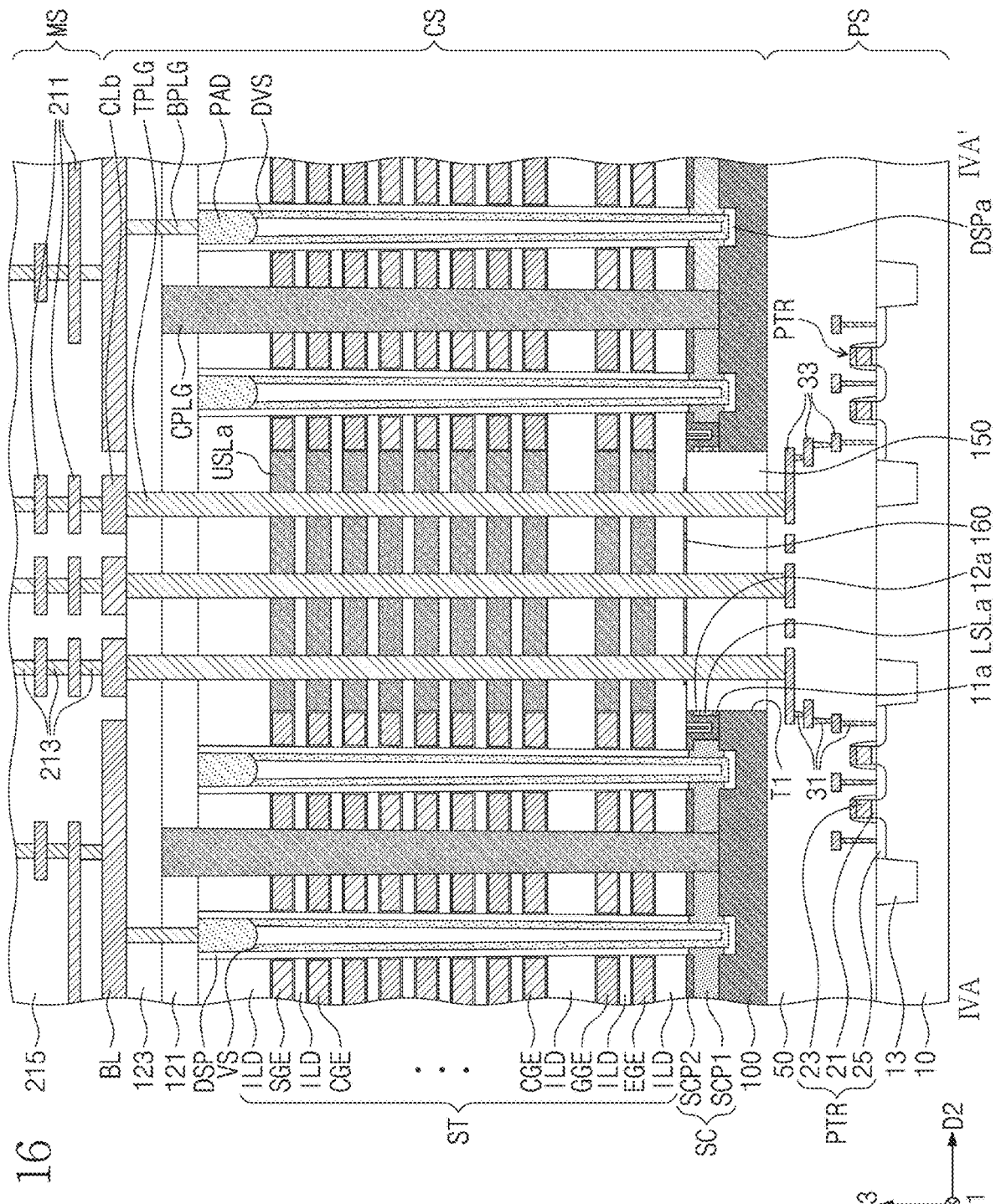

Referring to FIG. 16, after the formation of the electrode structure ST, the vertical insulating patterns CPLG may be formed in the electrode separation regions ESR. The vertical insulating patterns CPLG may fill the electrode separation regions ESR. The vertical insulating patterns CPLG may be formed of or include at least one of silicon oxide or silicon nitride. Thereafter, the second interlayered insulating layer 123 may be formed on the first interlayered insulating layer 121 to cover the top surfaces of the vertical insulating patterns CPLG. The bit line contact plugs BPLG may be connected to the conductive bit line pads PAD through the first and second interlayered insulating layers 121 and 123. The bit lines BL described above may be formed on the second interlayered insulating layer 123. The bit lines BL may be connected to the bit line contact plugs BPLG. The metal line layer MS may be formed on the bit lines BL and the conductive lines CLb. The metal lines 211 and the metal vias 213 in the metal line layer MS may be connected to the bit lines BL and the conductive lines CLb.

According to some example embodiments of the inventive concepts, it may be possible to realize highly-reliable and highly-integrated three-dimensional semiconductor memory devices.

While some example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a peripheral circuit structure on a first substrate the peripheral circuit structure including peripheral circuits;
   a second substrate on the peripheral circuit structure;
   an electrode structure on the second substrate, the electrode structure including a plurality of electrodes that are stacked on the second substrate; and
   a penetrating interconnection structure penetrating the electrode structure and the second substrate,
   wherein the penetrating interconnection structure comprises a lower insulating pattern, a mold pattern structure on the lower insulating pattern, a protection pattern between the lower insulating pattern and the mold pattern structure, and a penetration plug,
   the penetration plug penetrates the mold pattern structure and the lower insulating pattern, and is connected to the peripheral circuit structure, and
   the protection pattern is at a level lower than that of a lowermost one of the electrodes.

2. The device of claim 1, wherein
   the electrodes are extended in a first direction, and
   a first width of the lower insulating pattern is greater than a second width of the protection pattern, when measured in a second direction crossing the first direction.

3. The device of claim 1, further comprising:
   a plurality of insulating layers that are included in the electrode structure and are alternately stacked with the electrodes,
   wherein the protection pattern is in contact with a top surface of the lower insulating pattern and a bottom surface of a lowermost one of the insulating layers.

4. The device of claim 1, wherein the penetration plug further penetrates the protection pattern.

5. The device of claim 1, further comprising:
   a source structure between the second substrate and the electrode structure,
   wherein the protection pattern is located at a level higher than a bottom surface of the source structure.

6. The device of claim 5, wherein a top surface of the protection pattern is located at a same level as a top surface of the source structure.

7. The device of claim 1, further comprising:
   an interlayered insulating layer on the electrode structure; and
   conductive lines on the interlayered insulating layer,
   wherein the penetration plug connects the conductive lines to the peripheral circuit structure.

8. The device of claim 1, wherein a thickness of the protection pattern is in a range from 1000 Å to 2000 Å.

9. The device of claim 1, wherein the protection pattern comprises a material having an etch selectivity with respect to the lower insulating pattern.

10. The device of claim 9, wherein the protection pattern comprises silicon nitride.

11. The device of claim 1, wherein
    the mold pattern structure comprises upper sacrificial patterns and insulating layers, the upper sacrificial patterns and the insulating layers being alternately stacked on the lower insulating pattern, and
    each of the upper sacrificial patterns is located at a same level as a corresponding one of the electrodes.

12. The device of claim 1, wherein the mold pattern structure vertically overlaps the lower insulating pattern and the protection pattern.

13. The device of claim 12, wherein
    the electrode structure comprises a first electrode structure and a second electrode structure on the first electrode structure,
    the device further comprises,
    a first vertical channel penetrating the first electrode structure and exposing a portion of the second substrate, and
    a second vertical channel penetrating the second electrode structure and exposing the first vertical channel, and
    a bottom diameter of the second vertical channel is smaller than a top diameter of the first vertical channel.

14. The device of claim 1, further comprising:
    a source structure on the second substrate, the source structure comprising a first source conductive pattern and a second source conductive pattern on the first source conductive pattern; and
    vertical structures penetrating the electrode structure and the source structure, portions of side surfaces of vertical structures being in contact with the source structure.

15. A method of fabricating a three-dimensional semiconductor memory device, comprising:
    forming a second substrate to cover a peripheral circuit structure formed on a first substrate, the second substrate comprising a first region and a second region;
    forming a lower insulating pattern on the peripheral circuit structure to penetrate the first region of the second substrate;
    forming an electrode structure on the second region, the electrode structure including insulating layers and electrodes, the insulating layers and the electrodes being alternately stacked on the second substrate;
    forming interlayered insulating layers to cover the electrode structure; and
    forming a penetration plug to penetrate the interlayered insulating layers and the lower insulating pattern, and to be electrically connected to the peripheral circuit structure.

16. The method of claim 15, wherein the forming the lower insulating pattern comprises:
    forming a first buffer insulating layer, a lower sacrificial layer, a second buffer insulating layer, a source conductive layer, and a third buffer insulating layer on the second substrate;
    etching the first buffer insulating layer, the lower sacrificial layer, the second buffer insulating layer, the source conductive layer, and the third buffer insulating layer to form a first trench on the first region;
    forming a lower insulating layer on the first region and the second region to fill the first trench and forming a protection layer on the lower insulating layer; and
    partially removing the lower insulating layer and the protection layer on the second region to form the lower insulating pattern and a protection pattern on the lower insulating pattern.

17. The method of claim 16, wherein the partially removing the lower insulating layer and the protection layer on the second region comprises:
    performing a dry etching process to partially remove the lower insulating layer and the protection layer and to form a protruding portion of the lower insulating layer on the second region; and
    performing a chemical mechanical polishing process to remove the protruding portion of the lower insulating layer.

18. The method of claim 16, further comprising:
performing a wet etching process to remove a portion of a top surface of the lower insulating pattern, which is exposed by the protection pattern, and the third buffer insulating layer, after forming the lower insulating pattern and the protection pattern.

19. A three-dimensional semiconductor memory device, comprising:
a peripheral circuit structure including peripheral circuits on a first substrate, peripheral circuit lines connected to the peripheral circuits, and peripheral insulating layers covering the peripheral circuit lines;
a second substrate on the peripheral circuit structure;
an electrode structure including electrodes and insulating layers, the electrodes and the insulating layers being alternately stacked on the second substrate;
a source structure between the second substrate and the electrode structure;
vertical structures penetrating the electrode structure and the source structure;
an interlayered insulating layer on the electrode structure;
conductive lines on the interlayered insulating layer; and
a penetrating interconnection structure penetrating the electrode structure and the second substrate,
wherein the penetrating interconnection structure comprises a lower insulating pattern, a mold pattern structure on the lower insulating pattern, a protection pattern between the lower insulating pattern and the mold pattern structure, and a penetration plug,
the penetration plug penetrates the mold pattern structure, the protection pattern, and the lower insulating pattern, and connects the conductive lines to the peripheral circuit lines, and
the protection pattern is at a level lower than that of a lowermost one of the electrodes.

20. The device of claim 19, wherein
the electrodes are extended in a first direction, and
a first width of the lower insulating pattern is greater than a second width of the protection pattern, when measured in a second direction crossing the first direction.

* * * * *